(12) United States Patent
Yen

(10) Patent No.: US 9,698,048 B2
(45) Date of Patent: Jul. 4, 2017

(54) METHOD OF FABRICATING SEMICONDUCTOR DEVICE

(71) Applicant: Taiwan Semiconductor Manufacturing Co., Ltd., Hsin-Chu (TW)

(72) Inventor: Yung-Sung Yen, New Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/051,798

(22) Filed: Feb. 24, 2016

(65) Prior Publication Data

US 2016/0284590 A1  Sep. 29, 2016

Related U.S. Application Data

(60) Provisional application No. 62/139,366, filed on Mar. 27, 2015.

(51) Int. Cl.
| | |
|---|---|
| *H01L 21/768* | (2006.01) |
| *H01L 21/033* | (2006.01) |
| *H01L 21/311* | (2006.01) |

(52) U.S. Cl.
CPC .. *H01L 21/76816* (2013.01); *H01L 21/31144* (2013.01); *H01L 21/76811* (2013.01); *H01L 21/76897* (2013.01)

(58) Field of Classification Search
None
See application file for complete search history.

(56) References Cited

U.S. PATENT DOCUMENTS

| | | |
|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |

(Continued)

*Primary Examiner* — Khaja Ahmad
(74) *Attorney, Agent, or Firm* — Haynes and Boone, LLP

(57) ABSTRACT

A method for fabricating a semiconductor device includes forming a first material layer over a substrate, forming a middle layer over the first material layer, forming a first hard mask (HM) layer over the middle layer, forming a second HM layer over the first HM layer, forming a first trench in the second HM layer that extends into the first HM layer, forming a second trench in the second HM layer, The second trench is parallel to the first trench. The method also includes forming a first hole feature in the middle layer within the first trench by using the second HM layer and the first HM layer as a mask and forming a second hole feature in the middle layer within the second trench by using the second HM layer as a mask.

20 Claims, 40 Drawing Sheets

(56) References Cited

U.S. PATENT DOCUMENTS

| | | |
|---|---|---|
| 2008/0081461 A1* | 4/2008 | Lee ................... H01L 21/0337 438/637 |
| 2008/0153283 A1* | 6/2008 | Abdelrahman ... H01L 21/02063 438/618 |
| 2014/0001574 A1 | 1/2014 | Chen et al. |
| 2014/0110755 A1 | 4/2014 | Colinge |
| 2014/0151812 A1 | 6/2014 | Liaw |

\* cited by examiner

| 320 |
|---|
| 310 |
| 230 |
| 220 |
| 210 |

# METHOD OF FABRICATING SEMICONDUCTOR DEVICE

CROSS-REFERENCE

This application claims the benefit of U.S. Provisional Patent Application Ser. No. 62/139,366 filed on Mar. 27, 2015, the entire disclosure of which is hereby incorporated herein by reference.

BACKGROUND

The semiconductor integrated circuit (IC) industry has experienced rapid growth. Technological advances in IC design and material have produced generations of ICs where each generation has smaller and more complex circuits than previous generations.

When fabricating integrated circuits, various features such as metal lines are formed into a semiconductor substrate. To form these features, photo-masks are used to form a pattern into a photo-resist layer. The regions where the photo-resist layer is removed expose the underlying substrate to an etching process used to form trenches where metal is subsequently placed.

As the patterns formed into photoresist layers become increasingly dense, challenges rise to overcome adverse impacts of misalignment or irregularities/distortions of patterns in photoresist layers during formation of various features in the semiconductor substrate.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
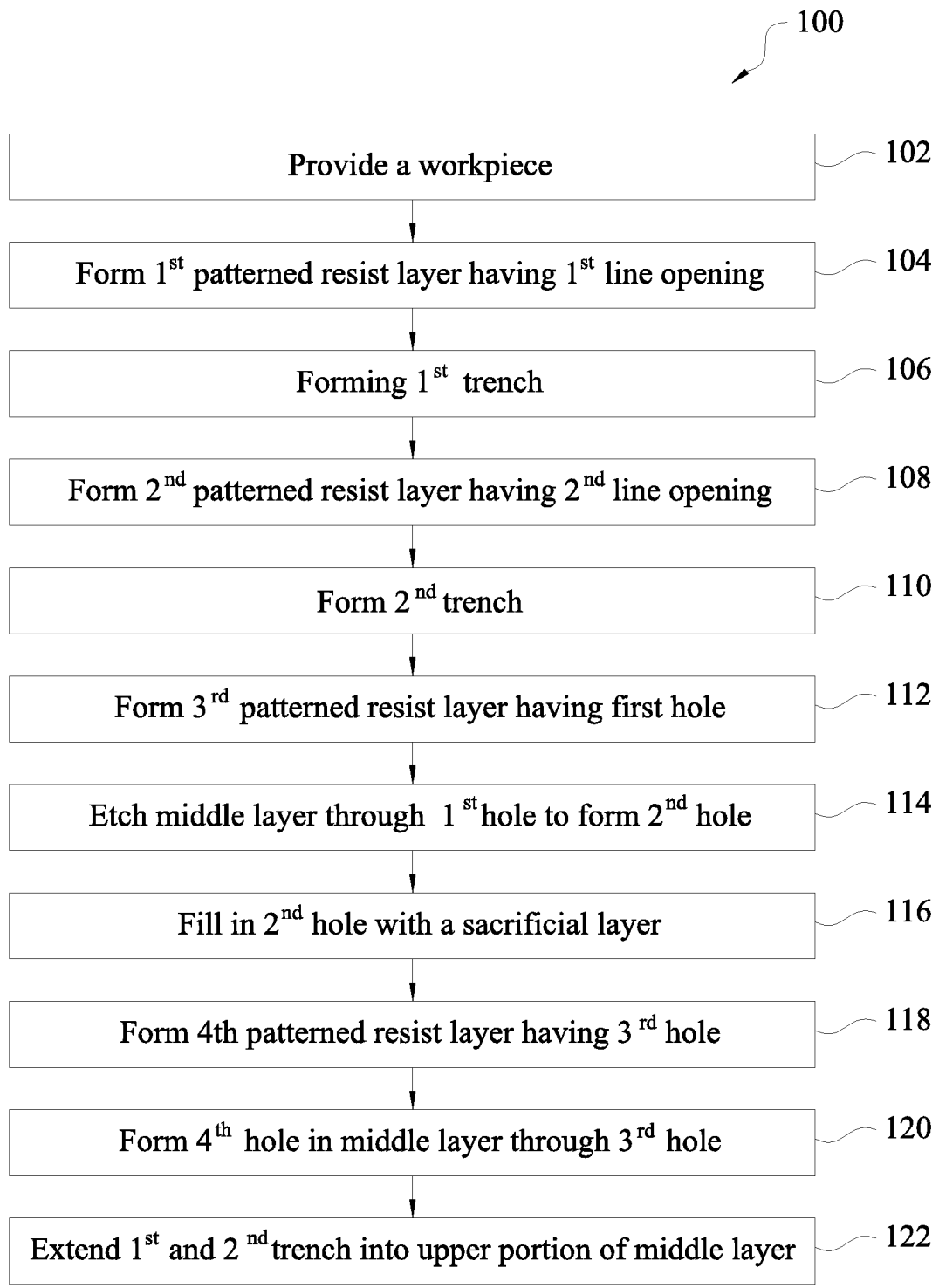
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a workpiece 205 of a semiconductor device 200 shown in FIG. 2 and the semiconductor device 200, shown in FIGS. 4A to 13C.

Figure 2:
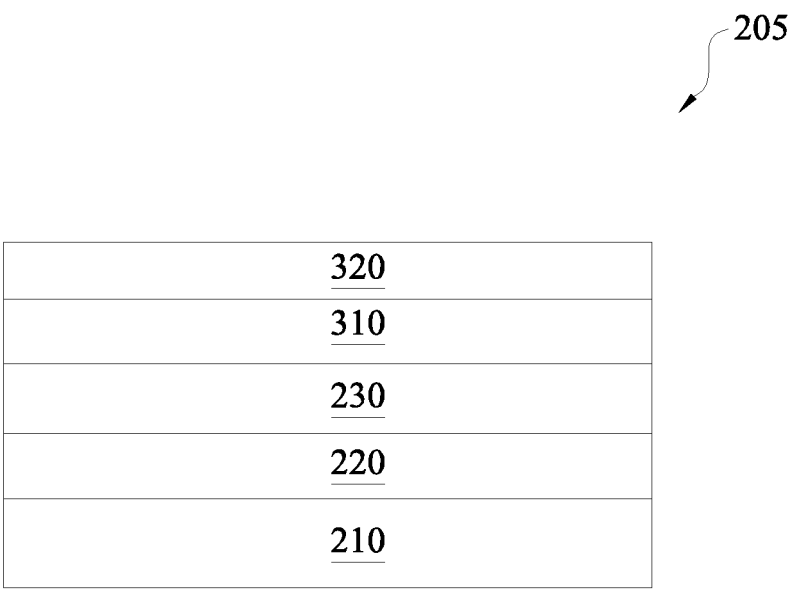
FIG. 2 is a cross section view of an example of a workpiece of a semiconductor device in accordance with some embodiments.

Referring to FIGS. 1 and 2, the method 100 starts at step 102 by receiving a workpiece 205 of the semiconductor device 200. The workpiece 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various p-type doped regions and/or n-type doped regions, implemented by a process such as ion implantation and/or diffusion. Those doped regions include n-well, p-well, light doped region (LDD), doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of interlevel dielectric (ILD) layers and conductive features integrated to form an interconnect structure configured to couple the various p-type and n-type doped regions and the other functional features (such as gate electrodes), resulting a functional integrated circuit.

In the present embodiment, the workpiece 205 includes a first material layer 220 deposited over the substrate 210 and a stack of layers formed over the first material layer 220. The stack of layers includes a middle layer (or second material layer) 230, a first hard mask (HM) 310 and a second HM layer 320. The first material layer 220 may include a conductive layer such as a polysilicon, a metal layer, or/and other suitable material. The middle layer 230 may include a dielectric layer, such as silicon oxide, silicon nitride, or silicon oxynitride, low-k dielectric material, or other suitable materials.

The first and second HM layers, 310 and 320, may include silicon oxide, silicon nitride, oxynitride, silicon carbide, titanium oxide, titanium nitride, tantalum oxide, tantalum nitride, and/or any suitable materials. In the present embodiment, the first and second HM layers, 310 and 320, may include a material which is different from the first material layer 220 and the material layer 230 to achieve etching selectivity during subsequent etch processes. The second HM layer 320 may also include a material which is different from the first HM layer 310 to achieve etching selectivity during subsequent etch processes. The first material layer 220, the material layer 230, the first and second HM layers, 310 and 320, may be deposited over the substrate 210 by suitable techniques, such as chemical vapor deposition (CVD), atomic layer deposition (ALD), physical vapor deposition (PVD), thermal oxidation, combinations thereof, or other suitable techniques.

Figure 3A:
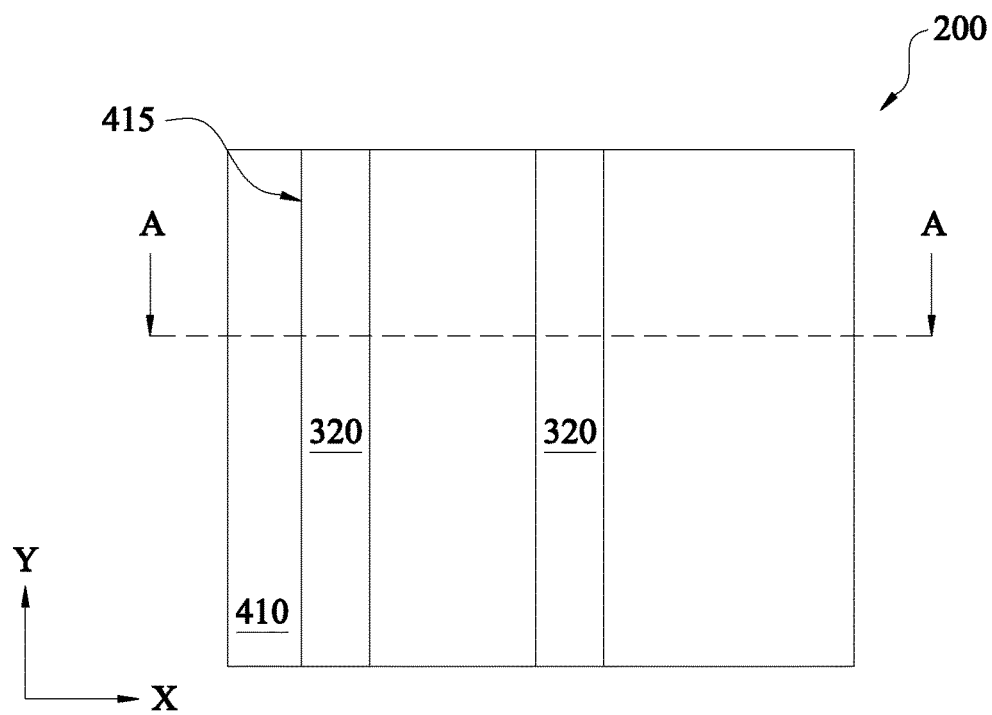
FIG. 3A is a top view of an example of a semiconductor device in accordance with some embodiments.
Figure 3B:
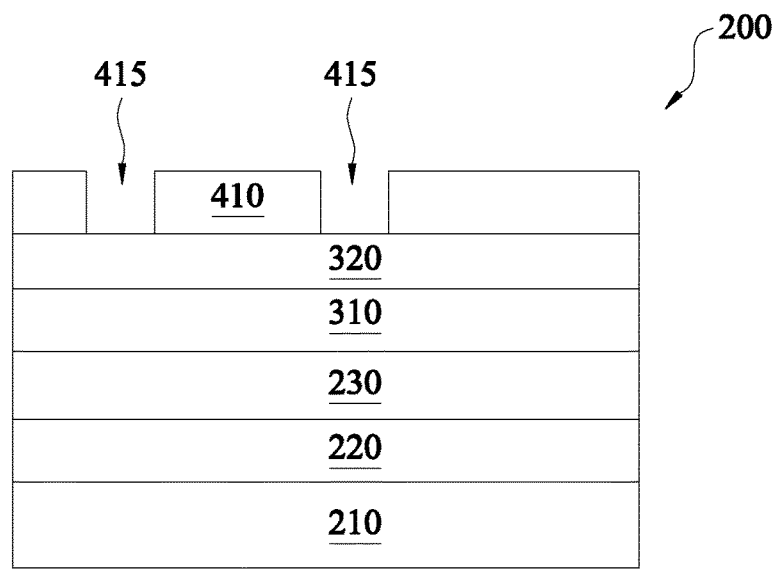
FIG. 3B is a cross-sectional view of an example semiconductor device in accordance with some embodiments, along the line A-A in FIG. 3A.

Referring to FIGS. 1 and 3A-3B, once the workpiece 205 is received, method 100 proceeds to step 104 by forming a first patterned resist layer 410 over the second HM layer 320. The first patterned resist layer 410 has a plurality of first line openings 415 parallel to each other and extend along a Y direction. And respective portions of the second HM layer 320 are exposed in the plurality of the first line openings 415. An exemplary lithography process may include forming a resist layer, exposing the resist layer by a lithography exposure process, performing a post-exposure bake process, and developing the resist layer to form the patterned resist layer.

Figure 4A:
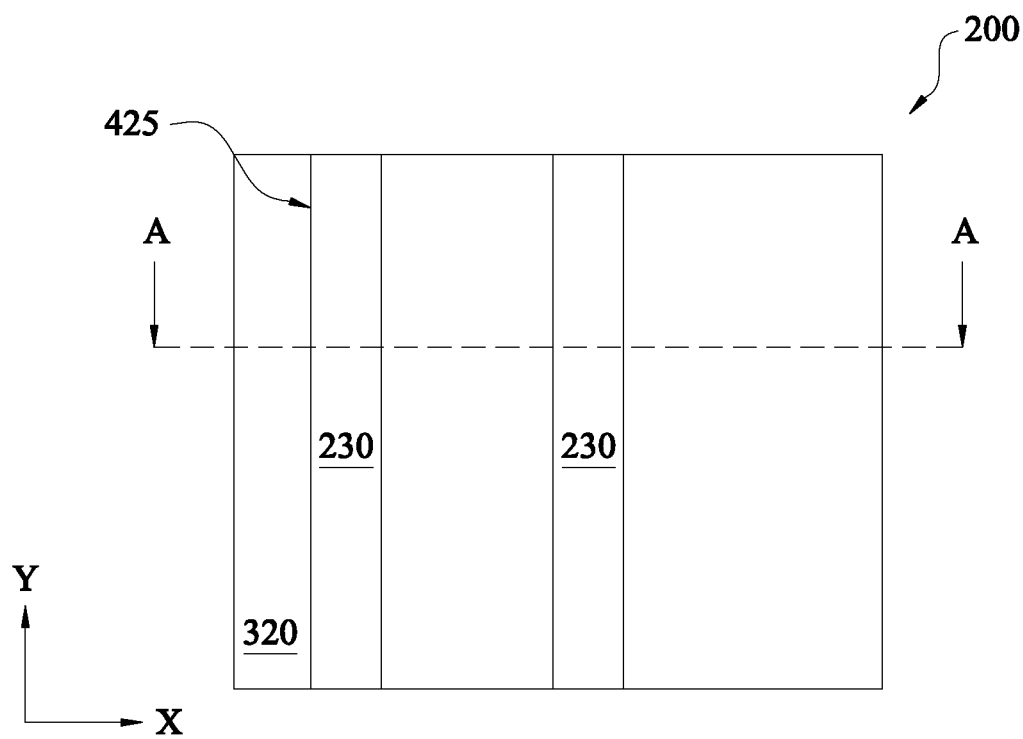
FIG. 4A is a top view of an example of a semiconductor device in accordance with some embodiments.
Figure 4B:
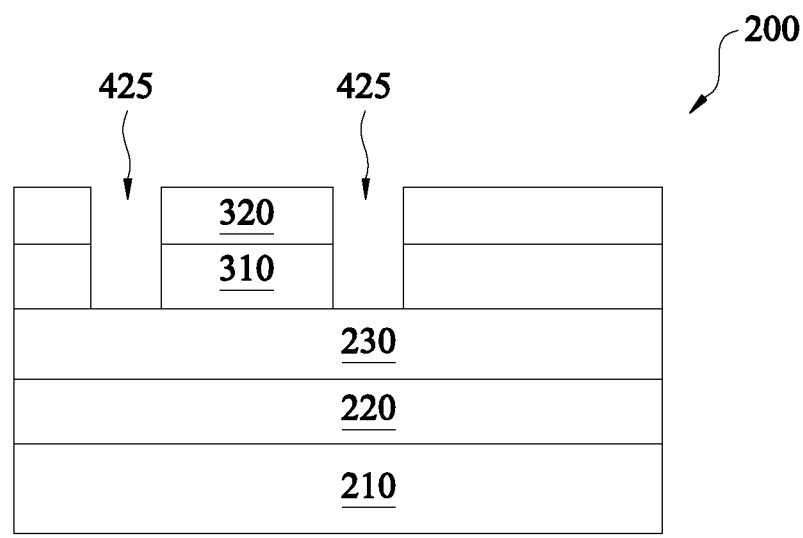
FIG. 4B is a cross-sectional view of an example semiconductor device in accordance with some embodiments, along the line A-A in FIG. 4A.

Referring to FIGS. 1 and 4A-4B, method 100 proceeds to step 106 by etching the second and first HM layers, 320 and 310, through the first patterned resist 410 to form a plurality of first trenches 425. Therefore the first trenches 425 are formed in both of first and second HM layers, 310 and 320. Respective portions of the first middle layer 230 are exposed within the first trenches 425. In some embodiments, the etch process is properly chosen to selectively etch the first and second HM layers, 310 and 320, but does not substantially etch the middle layer 230. As has been mentioned previously, with an adequate etch selectivity, the middle layer 230 serves as an etch stop layer, which improves etch process window and profile control. In some embodiments, the etch process includes an anisotropic dry etch. For example, the etch process is a plasma anisotropic etch. A resist strip process is then applied to remove the first patterned resist layers 410.

Figure 5A:
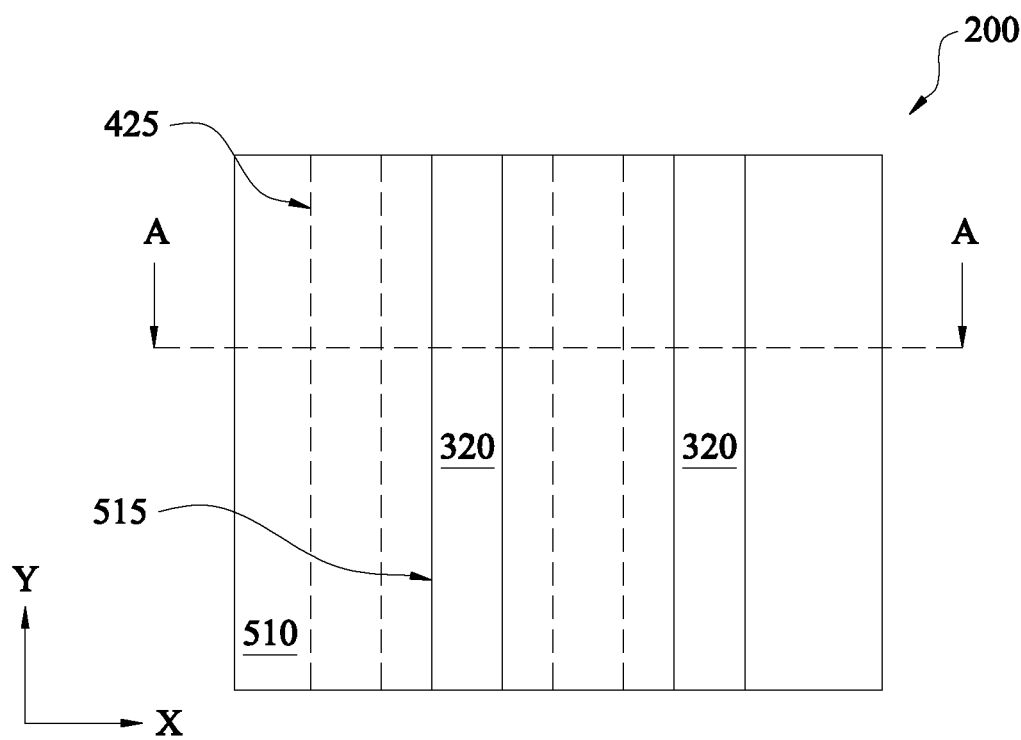
FIG. 5A is a top view of an example of a semiconductor device in accordance with some embodiments.
Figure 5B:
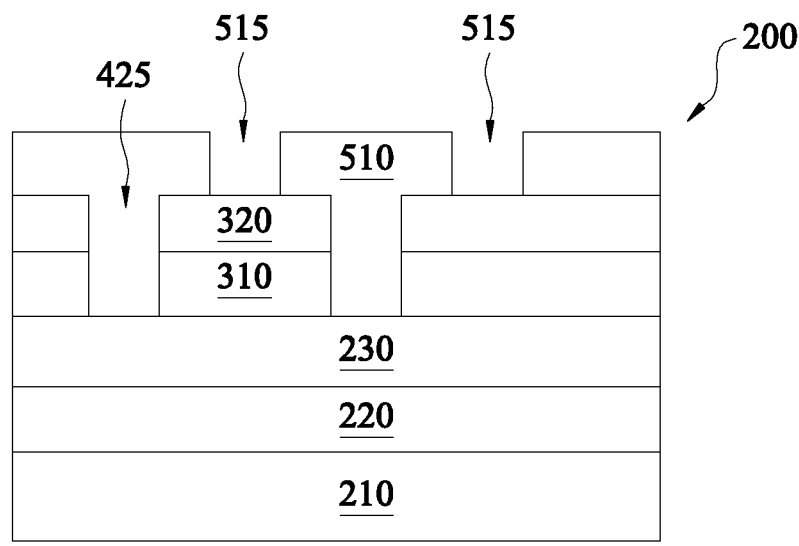
FIG. 5B is a cross-sectional view of an example semiconductor device in accordance with some embodiments, along the line A-A in FIG. 5A.

Referring to FIGS. 1 and 5A-5B, the method 100 proceeds to step 108 by forming a second patterned resist layer 510 over the second HM layer 320. The second patterned resist layer 510 has a plurality of second line openings 515 along the Y direction. In some embodiments, each second line opening 515 is positioned between two adjacent the first trenches 425, such that the first trench 425 and the second line opening 515 are positioned in a repetitive alternating manner, along a X direction. As shown, portions of the second HM layer 320 are exposed within the second line openings 515. The second patterned resist layer 510 is formed similarly in many respects to the first patterned resist layer 410 discussed above association with FIGS. 3A-3B.

Figure 6A:
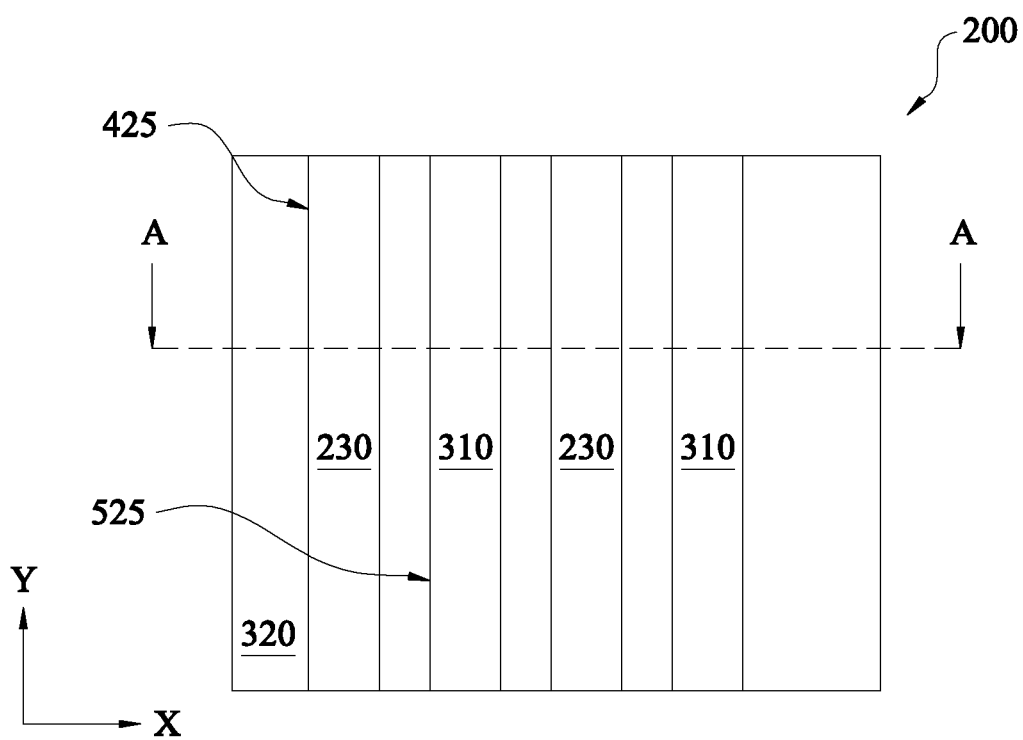
FIG. 6A is a top view of an example of a semiconductor device in accordance with some embodiments.
Figure 6B:
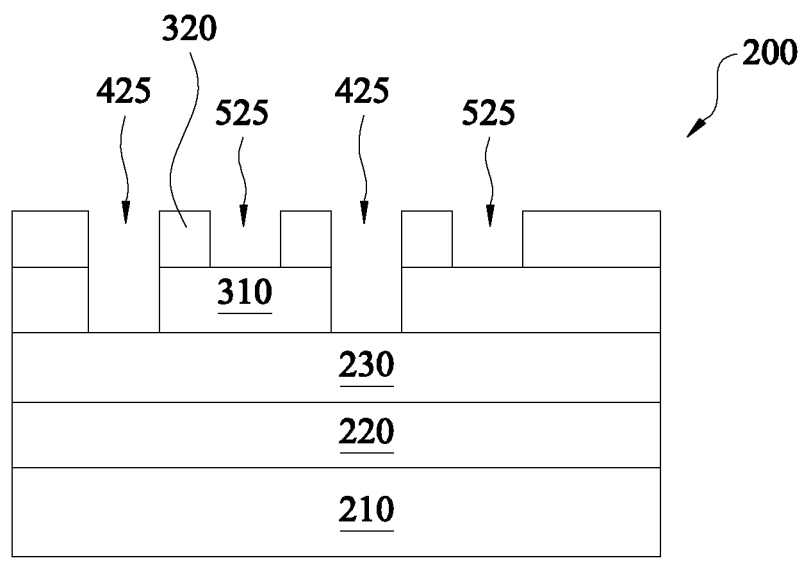
FIG. 6B is a cross-sectional view of an example semiconductor device in accordance with some embodiments, along the line A-A in FIG. 6A.

Referring to FIGS. 1 and 6A-6B, method 100 proceeds to step 110 by etching the second HM layer 320 through the second patterned resist 510 to form a plurality of second trenches 525 in the second HM layer 320. Respective portions of the first HM layer 310 are exposed within the second trenches 525. In the present embodiment, the etch process is properly chosen to selectively remove the second HM layer 320 but does not substantially etch the first HM layer 310. As has been mentioned previously, with an adequate etch selectivity, the first HM layer 310 serves as an etch stop layer, which improves etch process window and profile control. A resist strip process is then applied to remove any remaining second patterned resist layers 510.

Referring to FIGS. 1 and 7A-7C, method 100 proceeds to step 112 by forming a third patterned resist layer 610 over the second HM layer 320. The third patterned resist layer 610 has a plurality of first holes 615 overlapping with the first trench 425. Respective portions of the middle layer 230 are exposed within the first holes 615. The third patterned resist layer 610 is formed similarly in many respects to the first patterned resist layer 410 discussed above association with FIGS. 3A-3B.

Figure 7A:
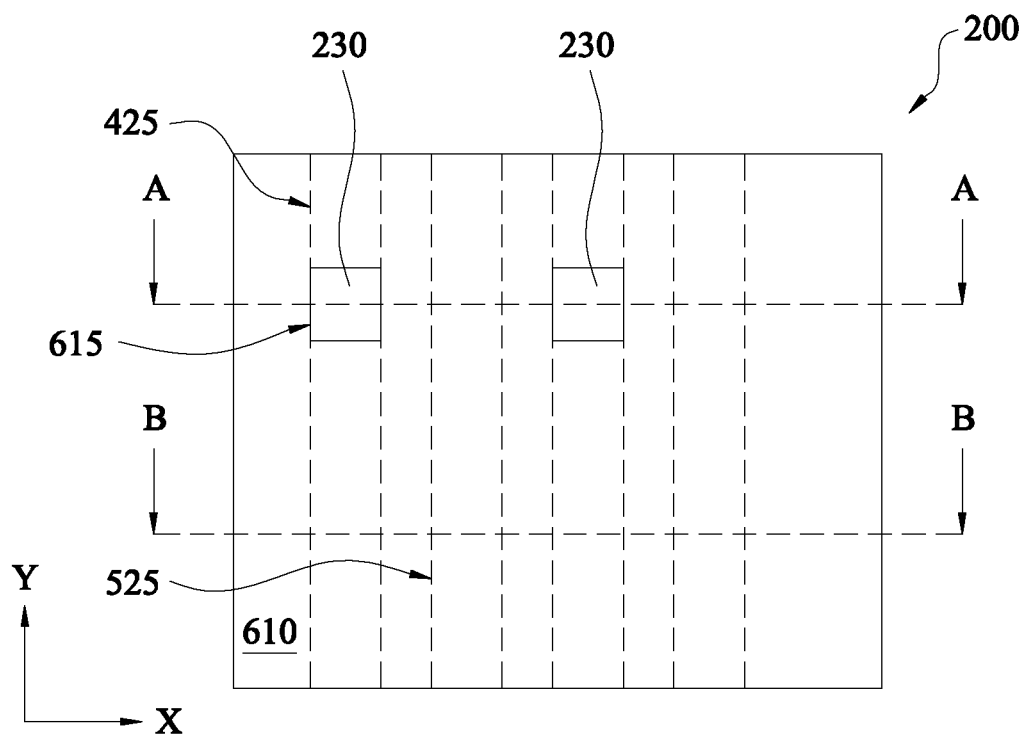
FIG. 7A is a top view of an example of a semiconductor device in accordance with some embodiments.
Figure 7B:
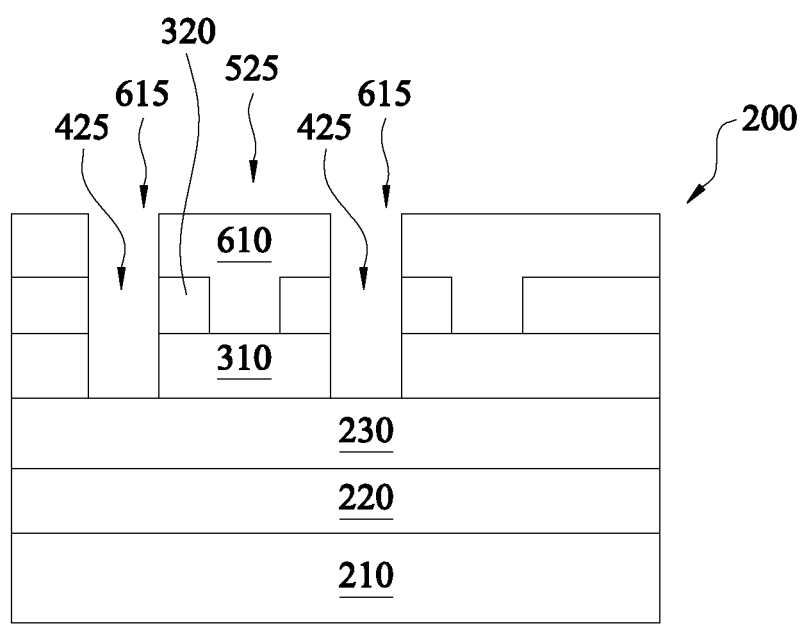
FIG. 7B is a cross-sectional view of an example semiconductor device in accordance with some embodiments, along the line A-A in FIG. 7A.
Figure 7C:
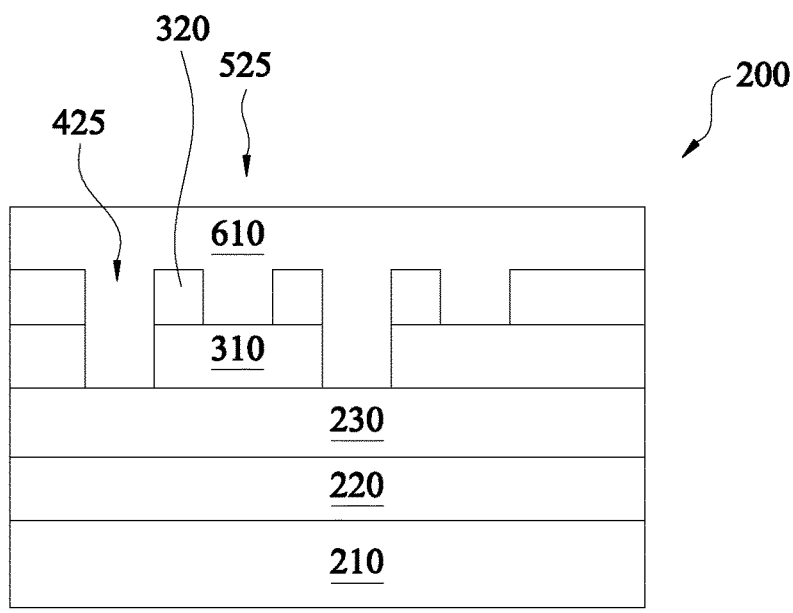
FIG. 7C is a cross-sectional view of an example semiconductor device in accordance with some embodiments, along the line B-B in FIG. 7A.
Figure 7D:
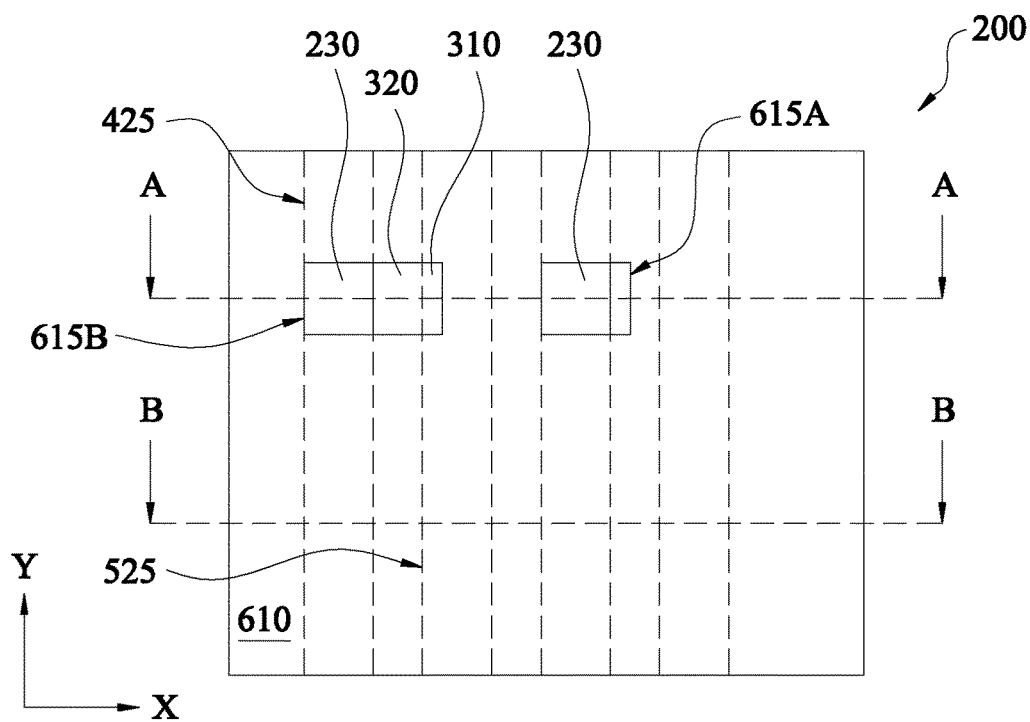
FIG. 7D is a top view of an example of a semiconductor device in accordance with some embodiments.
Figure 7E:
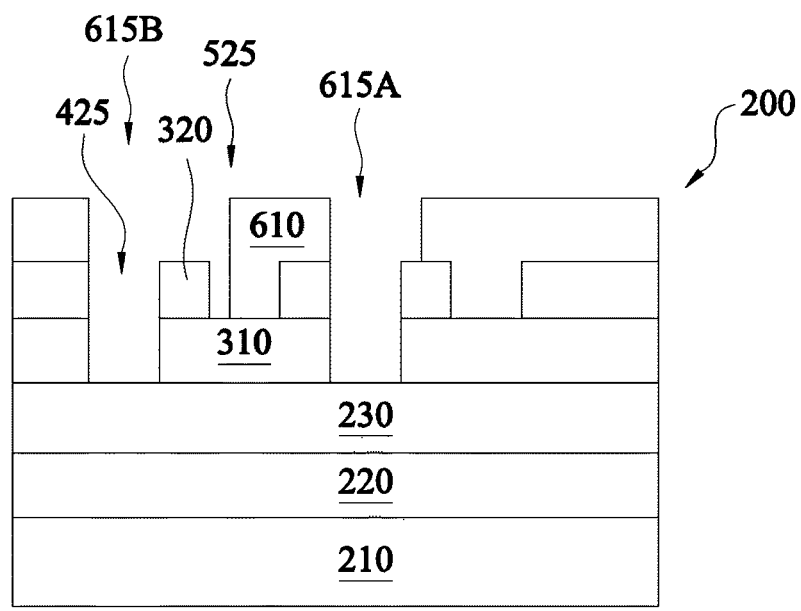
FIG. 7E is a cross-sectional view of an example semiconductor device in accordance with some embodiments, along the line A-A in FIG. 7D.
Figure 7F:
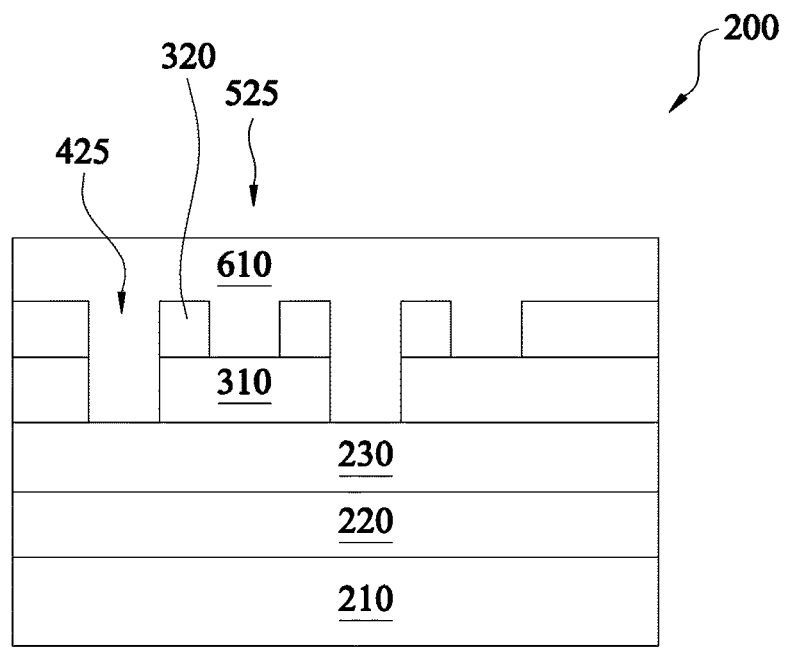
FIG. 7F is a cross-sectional view of an example semiconductor device in accordance with some embodiments, along the line B-B in FIG. 7D.

In some embodiments, it is designed that the first hole 615 having a larger width to obtain advantages, such as relaxing lithography process resolution constrains. In some embodiments, the exposure of the first HM layer 310 or both of the first and second HM layers, 320 and 310, is caused by adverse process impacts, such as pattern irregularities/distortions in the lithography process of forming the third patterned resist layer 610. FIGS. 7D-7E show such embodiments in which first holes 615 have a larger width. For example, first hole 615A exposes a portion of middle layer 230 within the first trench 425 and also a portion of the second HM layer 320 adjacent to the first trench 425 is exposed with the first hole 615A. Also, first hole 615B exposes a portion of the second HM layer 320 and a portion of the first HM layer 310 adjacent to the first trench 425.

Figure 8A:
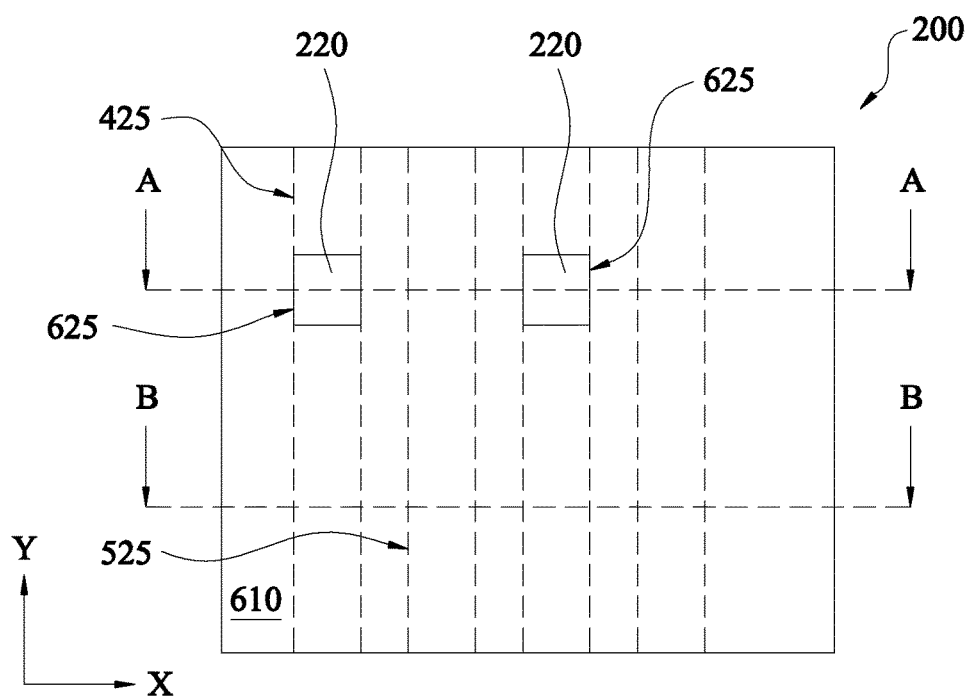
FIG. 8A is a top view of an example of a semiconductor device in accordance with some embodiments.
Figure 8B:
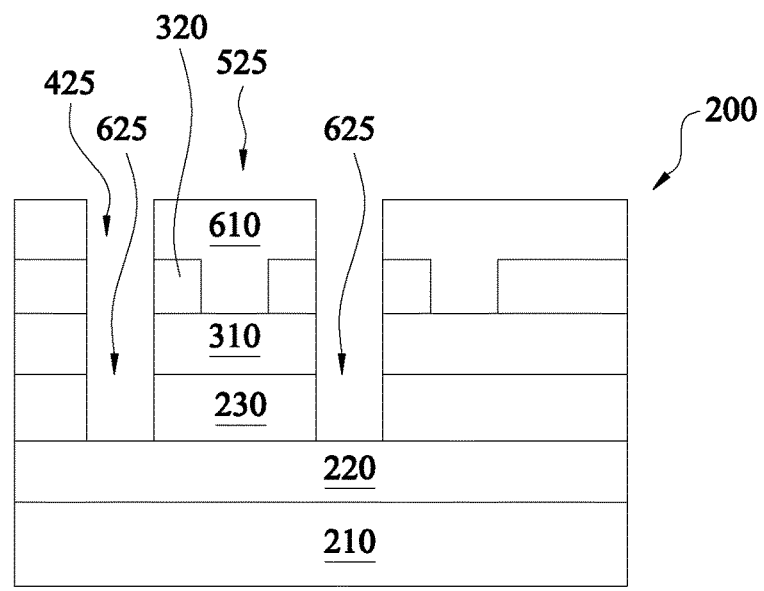
FIG. 8B is a cross-sectional view of an example semiconductor device in accordance with some embodiments, along the line A-A in FIG. 8A.
Figure 8C:
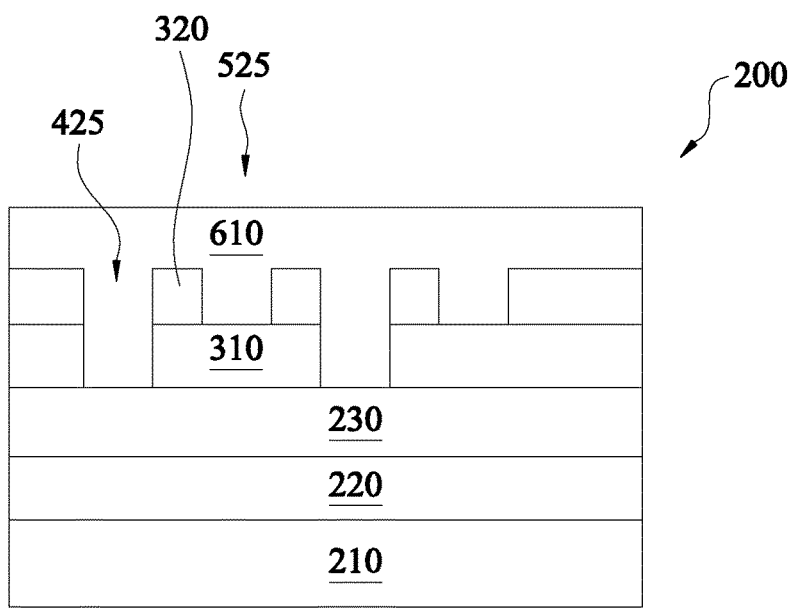
FIG. 8C is a cross-sectional view of an example semiconductor device in accordance with some embodiments, along the line B-B in FIG. 8A.

Referring to FIGS. 1 and 8A-8F, method 100 proceeds to step 114 by etching the middle layer 230 through the third patterned resist 610 to form a plurality of second holes 625 in the middle layer 230 within the first trench 425. Respective portions of the first material layer 220 are exposed within the second holes 625, as shown in FIGS. 8A-8C. The etch process may include wet etch, dry etch, or a combination thereof.

Figure 8D:
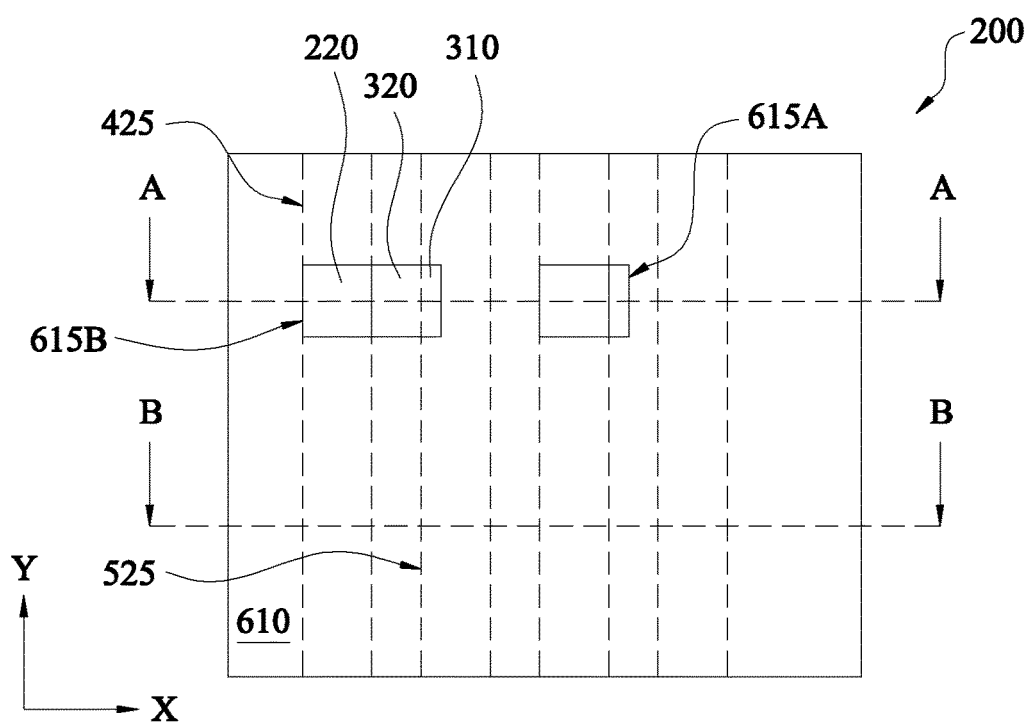
FIG. 8D is a top view of an example of a semiconductor device in accordance with some embodiments.
Figure 8E:
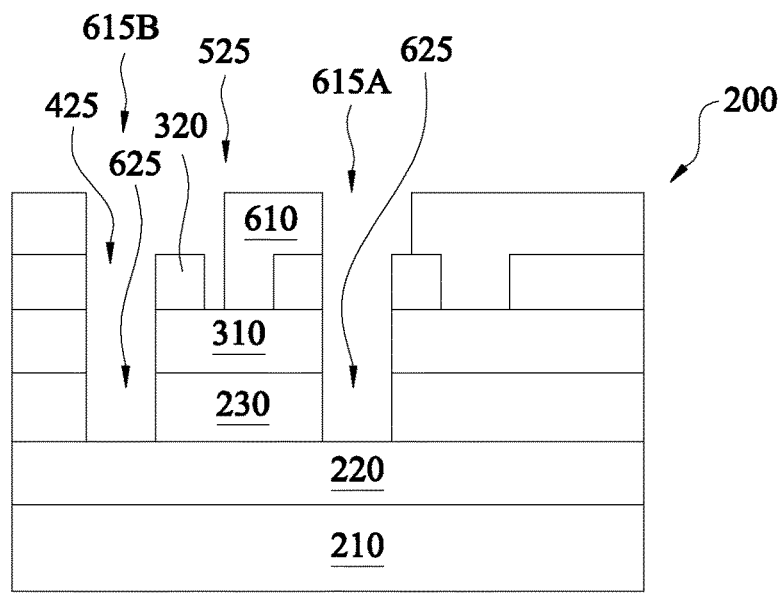
FIG. 8E is a cross-sectional view of an example semiconductor device in accordance with some embodiments, along the line A-A in FIG. 8D.
Figure 8F:
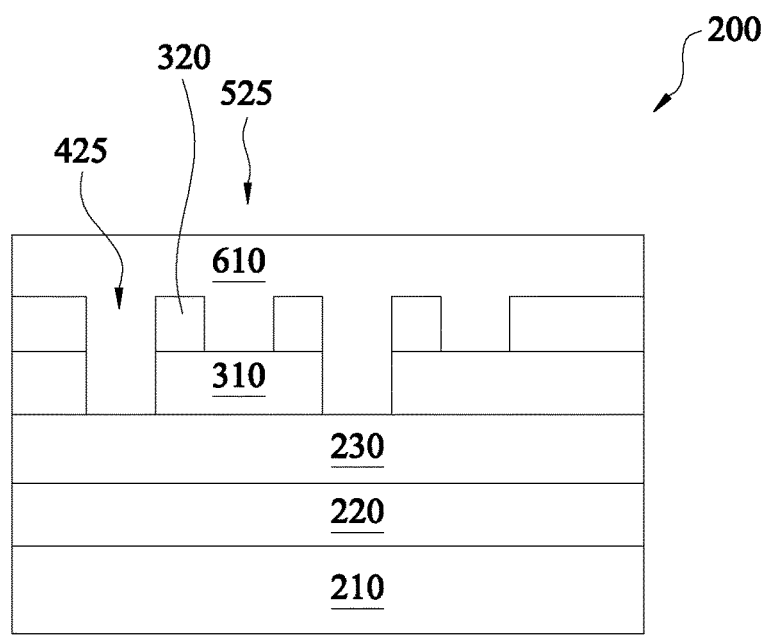
FIG. 8F is a cross-sectional view of an example semiconductor device in accordance with some embodiments, along the line B-B in FIG. 8D.
Figure 9A:
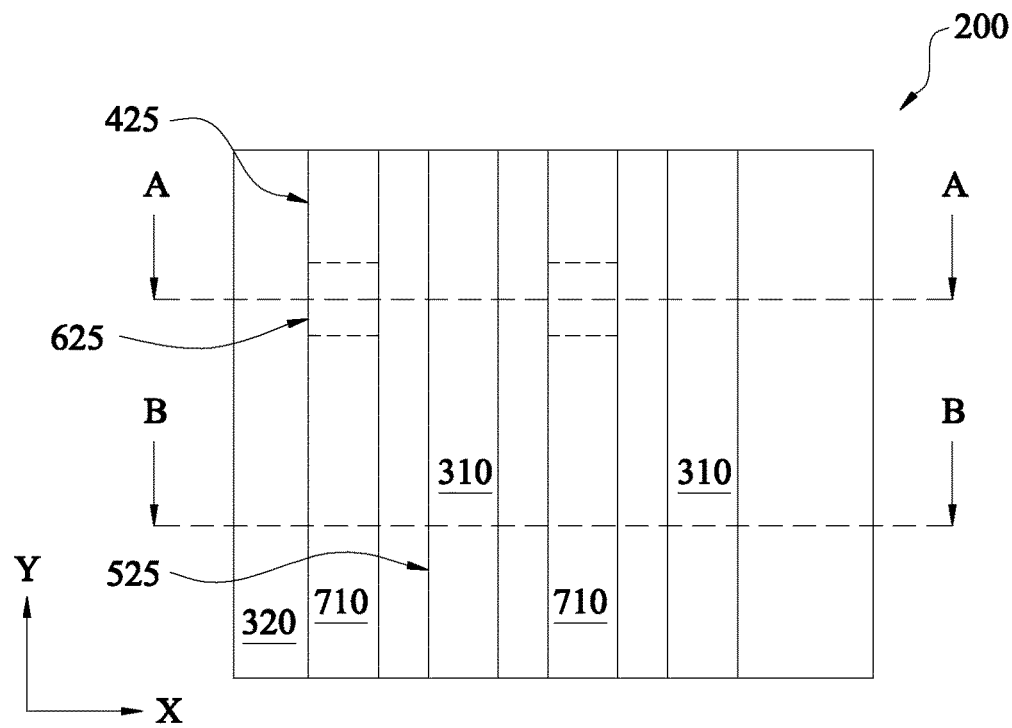
FIG. 9A is a top view of an example of a semiconductor device in accordance with some embodiments.
Figure 9B:
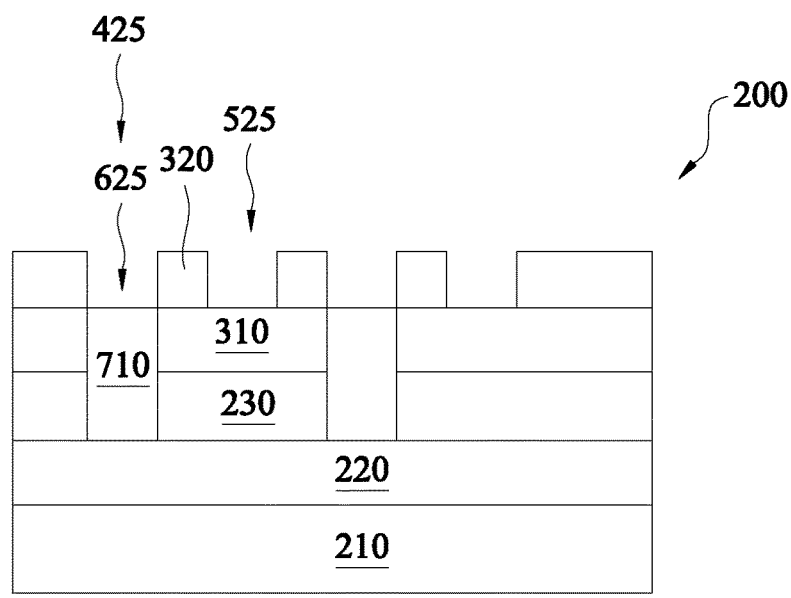
FIG. 9B is a cross-sectional view of an example semiconductor device in accordance with some embodiments, along the line A-A in FIG. 9A.
Figure 9C:
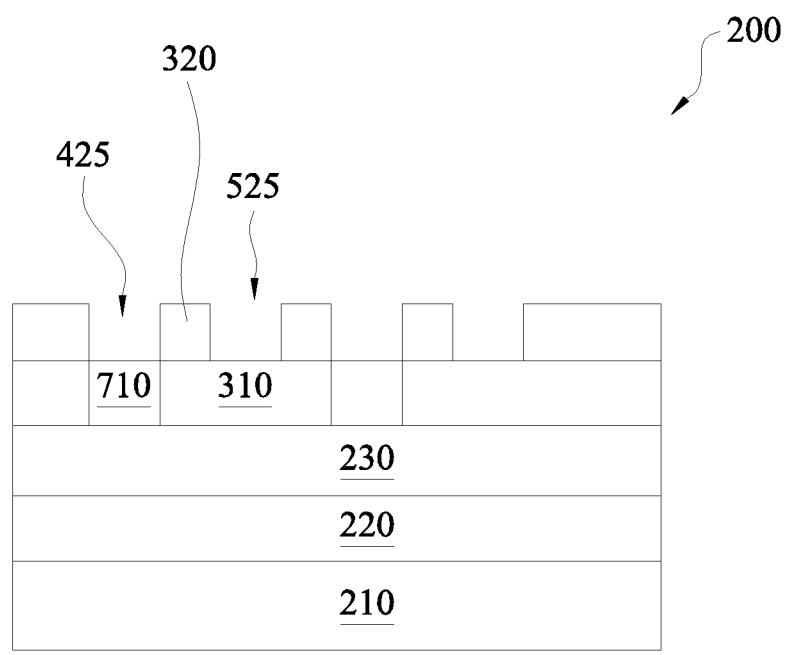
FIG. 9C is a cross-sectional view of an example semiconductor device in accordance with some embodiments, along the line B-B in FIG. 9A.

In the present embodiments, the etch process is properly chosen to selectively etch the middle layer 230 but does not substantially etch the second and first HM layers, 320 and 310. Thus, for circumstances where the second HM layer 320 is exposed in the first hole 615A, or both of the second HM layer 320 and the first HM layer 310 are exposed within the first hole 615B (as shown in FIGS. 7D-7E), the first and second HM layers, 320 and 310, serve as a sub-etch-mask to endue the second holes 625 to be formed within the first trench 425 with a self-alignment manner, as shown in FIGS. 8D-8F. A resist strip process is then applied to remove any remaining third patterned resist layers 610.

Referring to FIGS. 1 and 9A-9C, method 100 proceeds to step 116 by filling in the second hole 625 with a sacrificial layer 710. The sacrificial layer 710 may include spin-on glass, silicon oxide, silicon nitride, oxynitride, silicon carbide, and/or other suitable materials. In one embodiment, the sacrificial layer 710 includes a material which is different from the middle layer 230 and the second and first HM layers, 320 and 310, to achieve etching selectivity subsequent etches. The sacrificial layer 710 may be deposited by CVD, PVD, ALD, spin-on coating, or other suitable techniques. In some embodiments, the sacrificial layer 710 is deposited over the second HM layer 320, including fill in the second hole 625, the first trench 425 and the second trench 525. Then sacrificial layer 710 is removed from the second trench 425 and recessed in the first trench 425 as well. In the present embodiment, the etch process is properly chosen to selectively etch the sacrificial layer 710 but does not substantially etch the second and first HM layers, 320 and 310. The etch process is controlled such that the sacrificial layer 710 is removed from the second trench 525, the second hole 625 remains being filled by the sacrificial layer 710, the first trench 425 is partially filled by the sacrificial layer 710.

Referring to FIGS. 1 and 10A-10C, method 100 proceeds to step 118 by forming a fourth patterned resist layer 810 over the second HM layer 320 and the sacrificial layer 710. The fourth patterned resist layer 810 has a plurality of third holes 815 overlapping with the second trench 525. Respective portions of the first HM layer 310 are exposed within the third holes 815. The fourth patterned resist layer 810 is formed similarly in many respects to the first patterned resist layer 410 discussed above association with FIGS. 3A-3B.

Figure 10A:
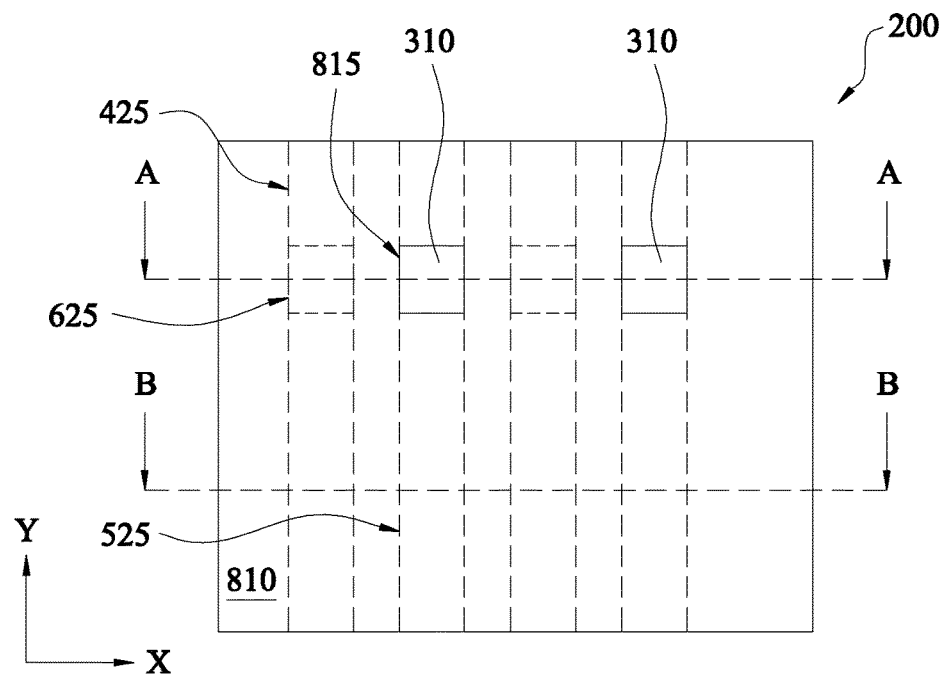
FIG. 10A is a top view of an example of a semiconductor device in accordance with some embodiments.
Figure 10B:
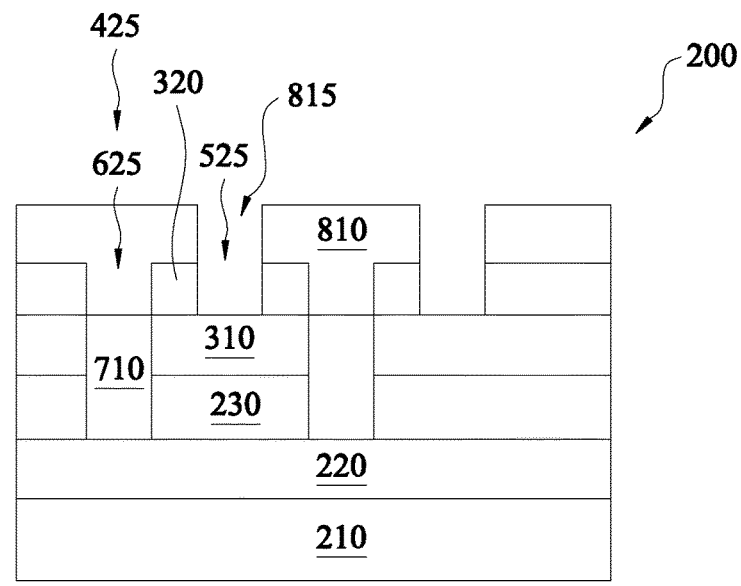
FIG. 10B is a cross-sectional view of an example semiconductor device in accordance with some embodiments, along the line A-A in FIG. 10A.
Figure 10C:
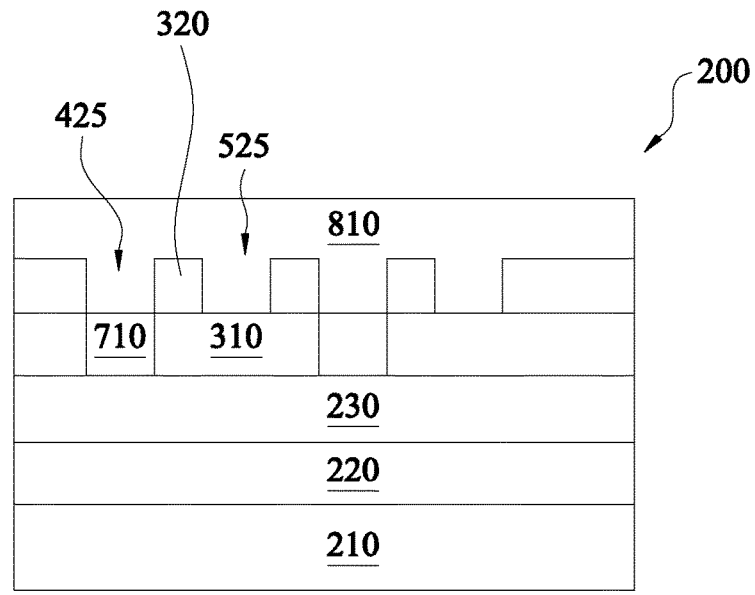
FIG. 10C is a cross-sectional view of an example semiconductor device in accordance with some embodiments, along the line B-B in FIG. 10A.
Figure 10D:
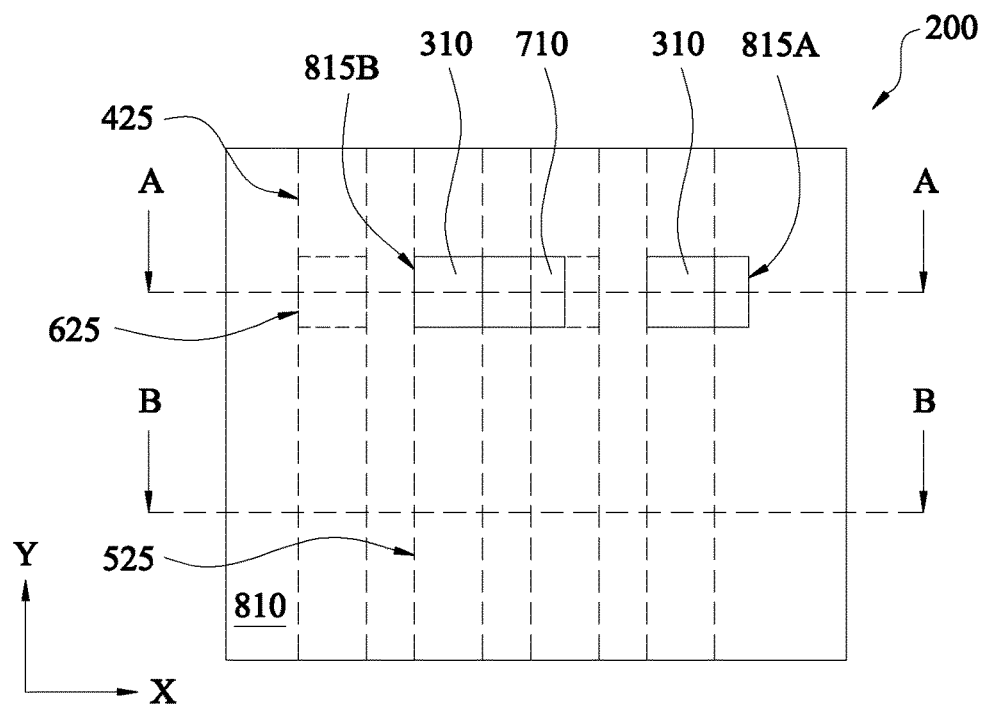
FIG. 10D is a top view of an example of a semiconductor device in accordance with some embodiments.
Figure 10E:
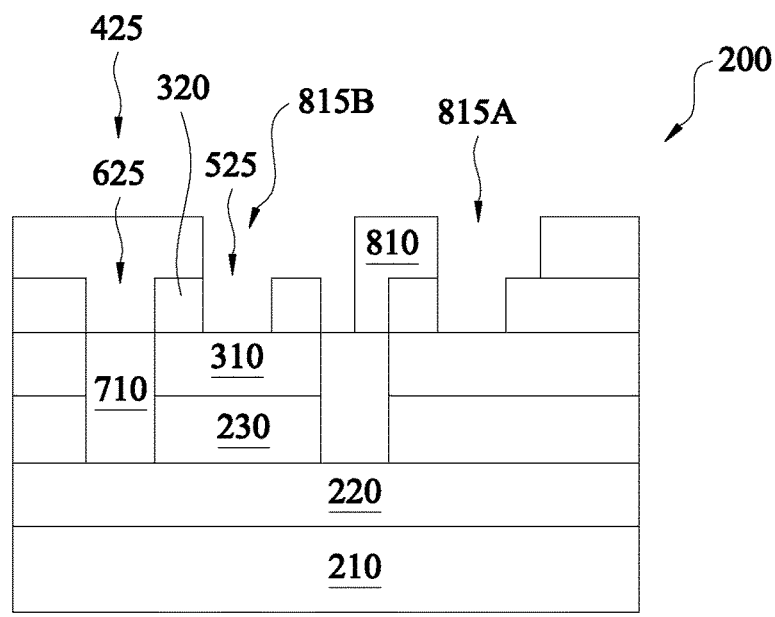
FIG. 10E is a cross-sectional view of an example semiconductor device in accordance with some embodiments, along the line A-A in FIG. 10D.
Figure 10F:
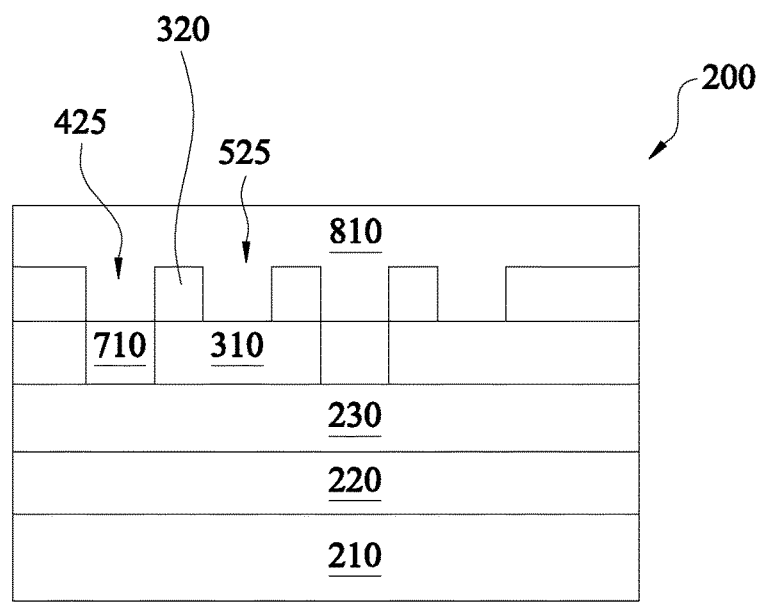
FIG. 10F is a cross-sectional view of an example semiconductor device in accordance with some embodiments, along the line B-B in FIG. 10D.

Sometimes, referring to FIGS. 10D-10F, not only the first HM layer 310 within the second trench 525 is exposed within the third hole 815 but also an adjacent second HM layer 320 is exposed with the same third hole 815, referred to as 815A, or the adjacent second HM layer 320 and a portion of an adjacent sacrificial layer 710 (in the second hole 615) are exposed within the same third hole 815, referred to as 815B. In some embodiments, it is designed that the third hole 815 having a larger width to obtain advantages, such as relaxing lithography process resolution constrains. In some embodiments, the exposure of the first HM layer 310 or the second HM layer 320 is caused by adverse process impacts, such as pattern irregularities/distortions in the lithography process of forming the fourth patterned resist layer 810.

Figure 11A:
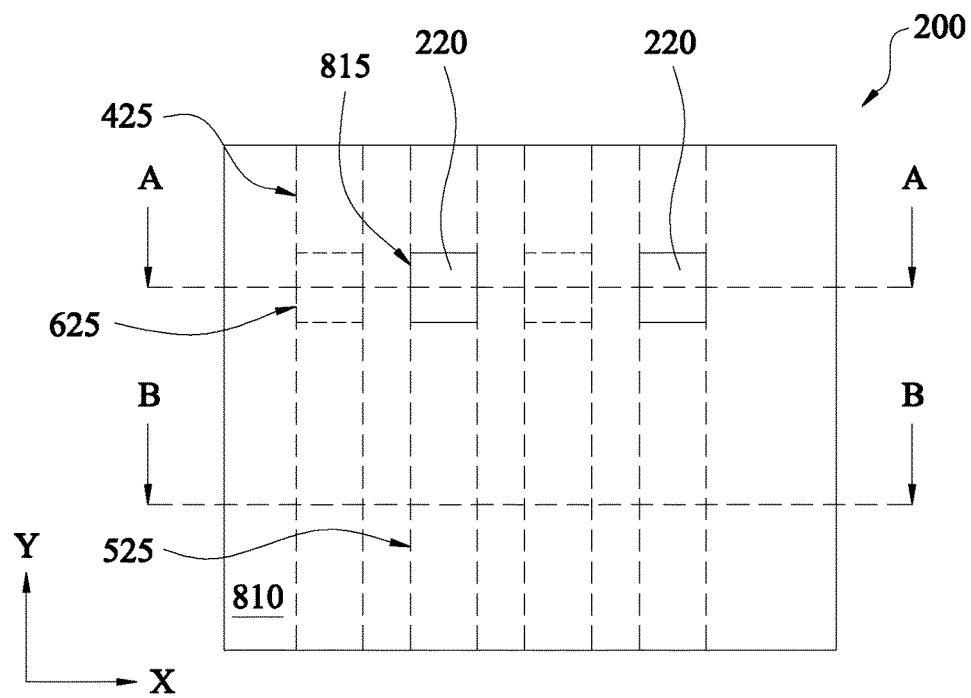
FIG. 11A is a top view of an example of a semiconductor device in accordance with some embodiments.
Figure 11B:
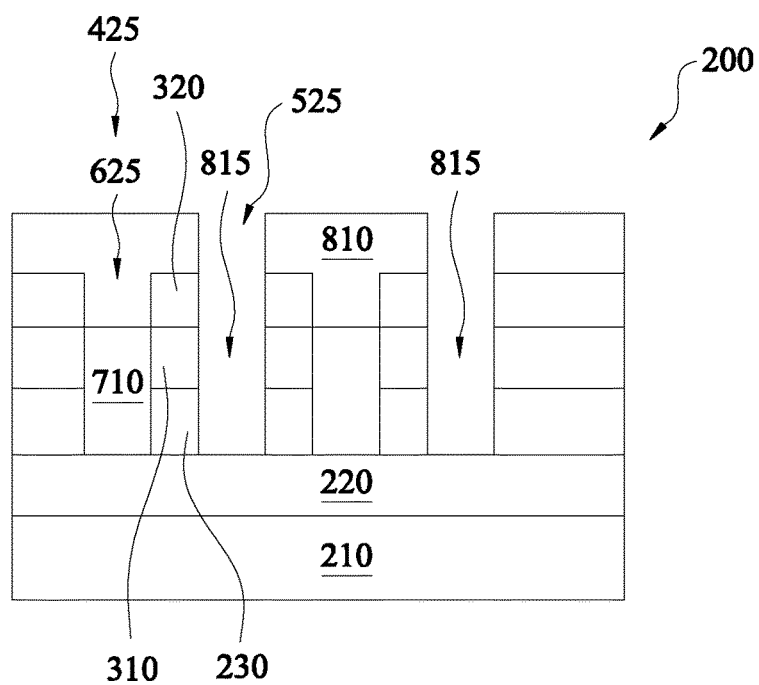
FIG. 11B is a cross-sectional view of an example semiconductor device in accordance with some embodiments, along the line A-A in FIG. 11A.
Figure 11C:
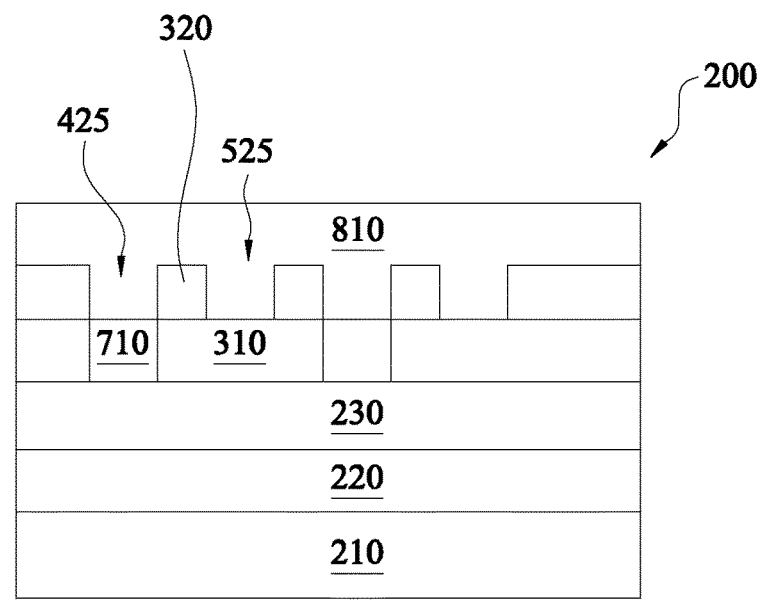
FIG. 11C is a cross-sectional view of an example semiconductor device in accordance with some embodiments, along the line B-B in FIG. 11A.
Figure 11D:
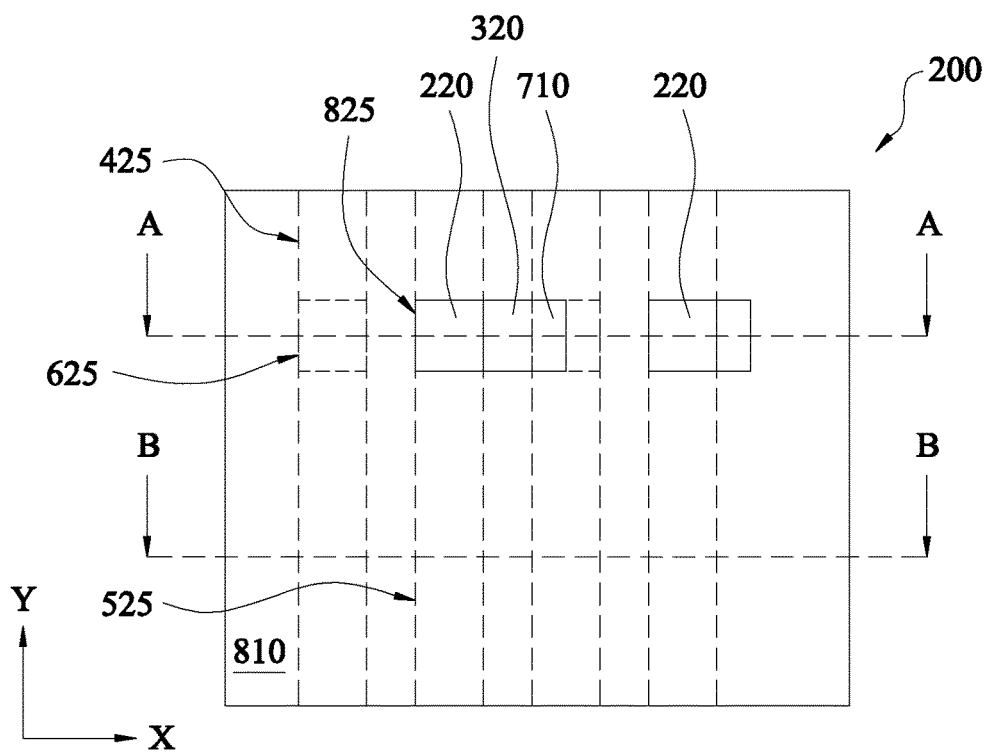
FIG. 11D is a top view of an example of a semiconductor device in accordance with some embodiments.
Figure 11E:
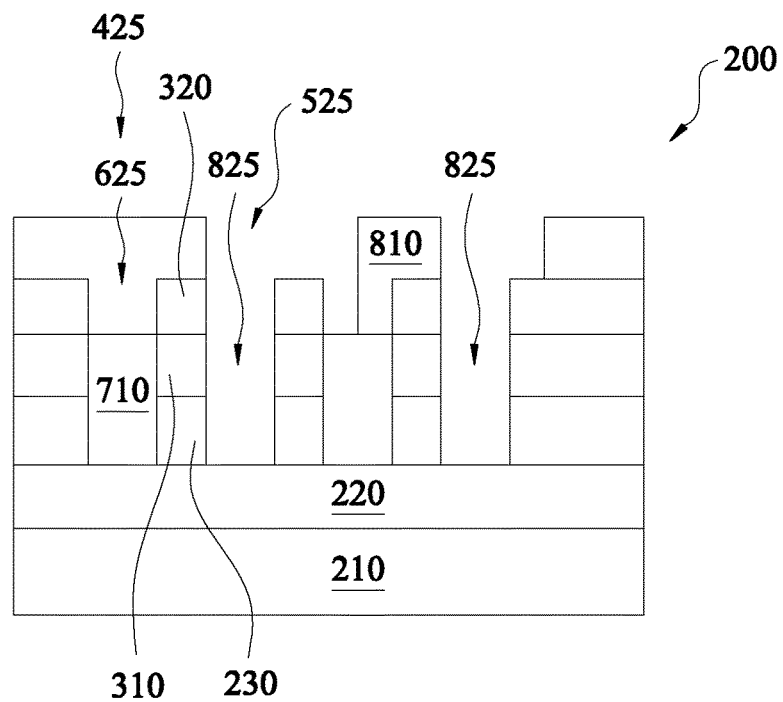
FIG. 11E is a cross-sectional view of an example semiconductor device in accordance with some embodiments, along the line A-A in FIG. 11D.
Figure 11F:
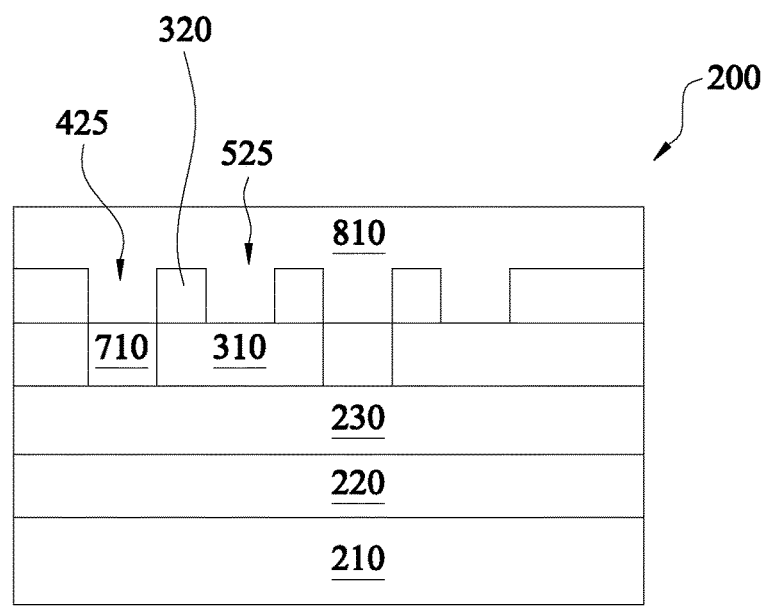
FIG. 11F is a cross-sectional view of an example semiconductor device in accordance with some embodiments, along the line B-B in FIG. 11D.
Figure 11G:
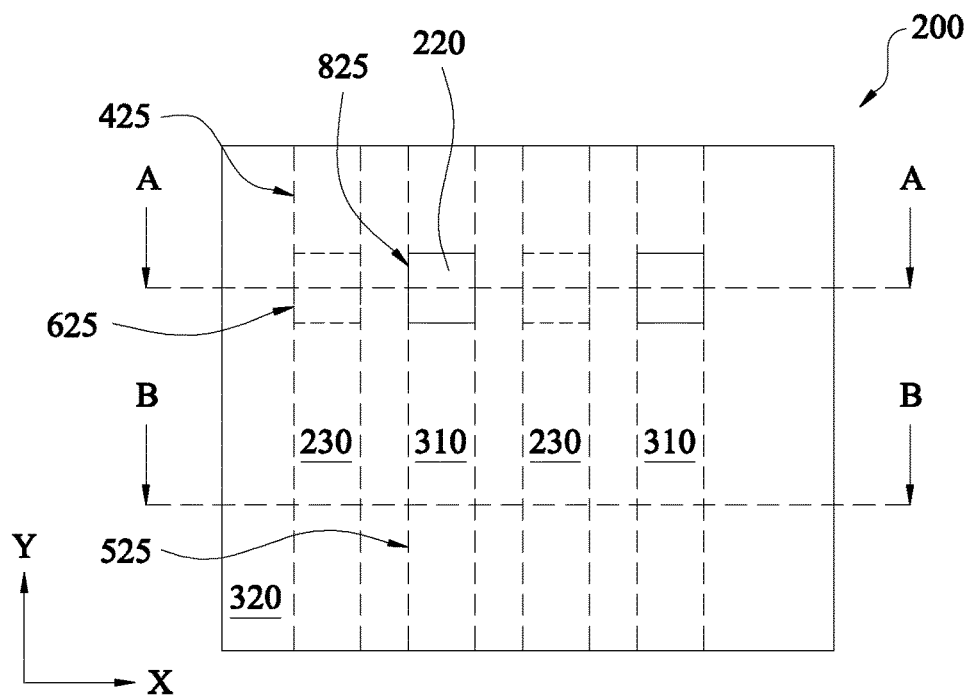
FIG. 11G is a top view of an example of a semiconductor device in accordance with some embodiments.
Figure 11H:
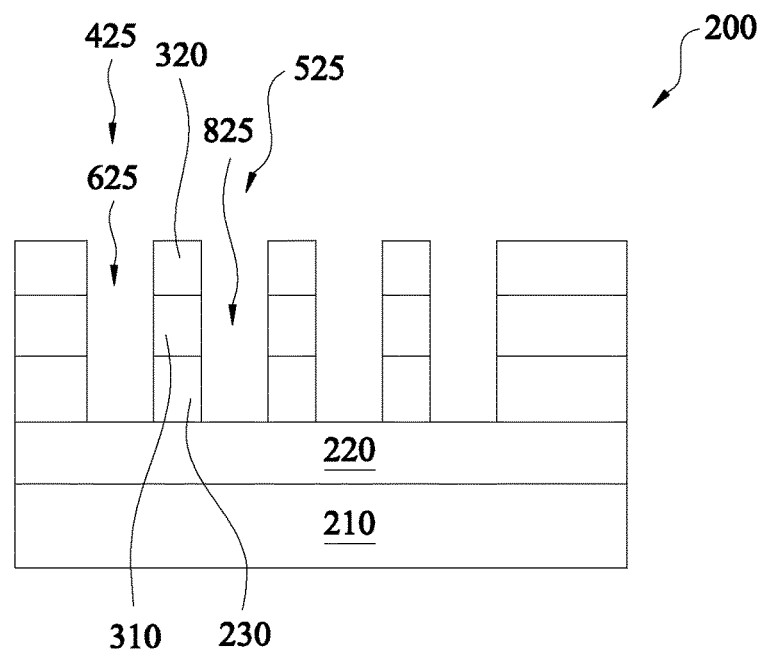
FIG. 11H is a cross-sectional view of an example semiconductor device in accordance with some embodiments, along the line A-A in FIG. 11G.
Figure 11I:
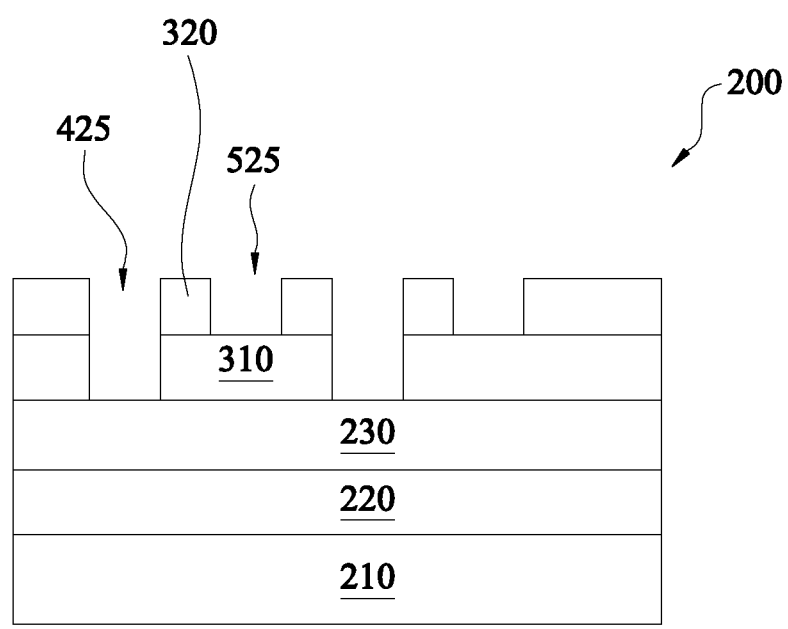
FIG. 11I is a cross-sectional view of an example semiconductor device in accordance with some embodiments, along the line B-B in FIG. 11G.
Figure 12A:
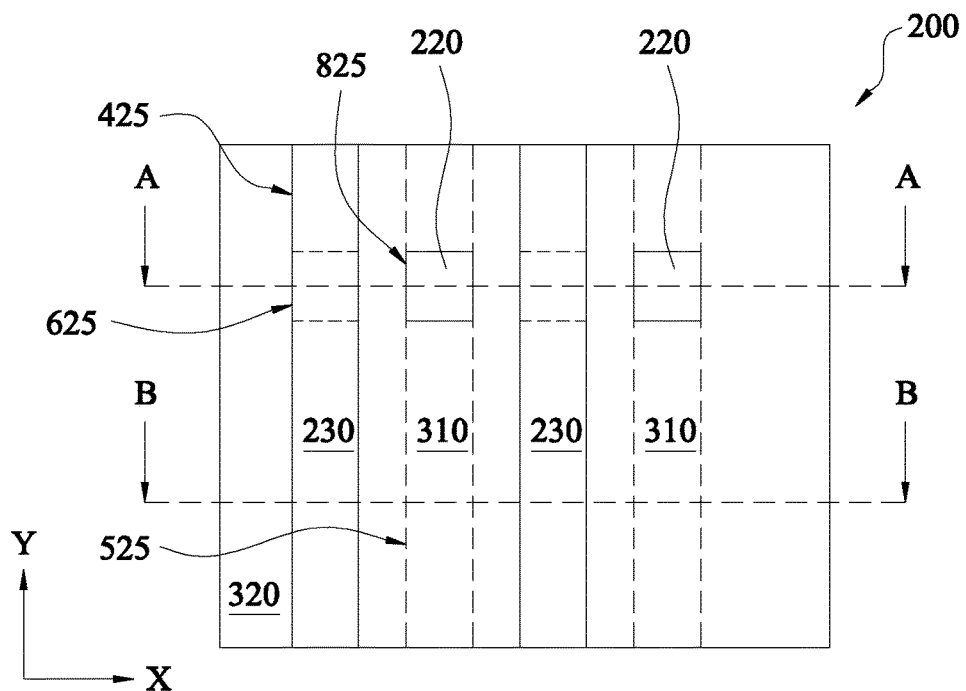
FIG. 12A is a top view of an example of a semiconductor device in accordance with some embodiments.
Figure 12B:
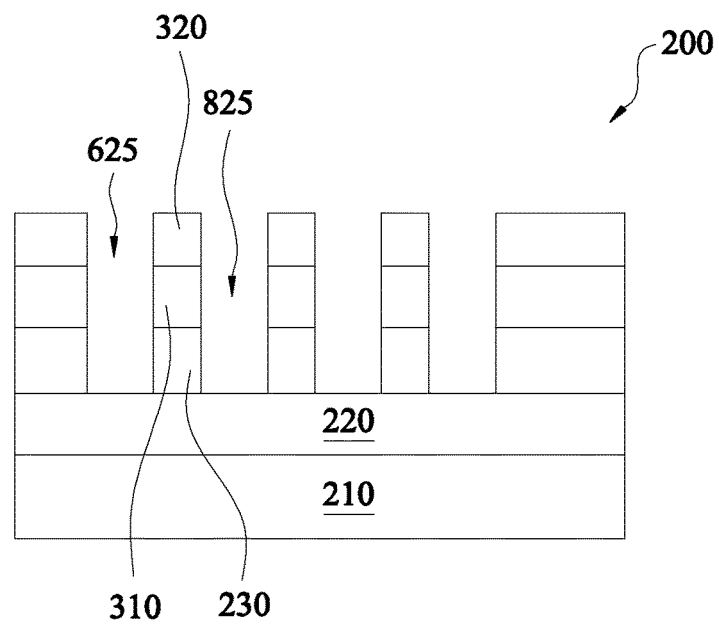
FIG. 12B is a cross-sectional view of an example semiconductor device in accordance with some embodiments, along the line A-A in FIG. 12A.
Figure 12C:
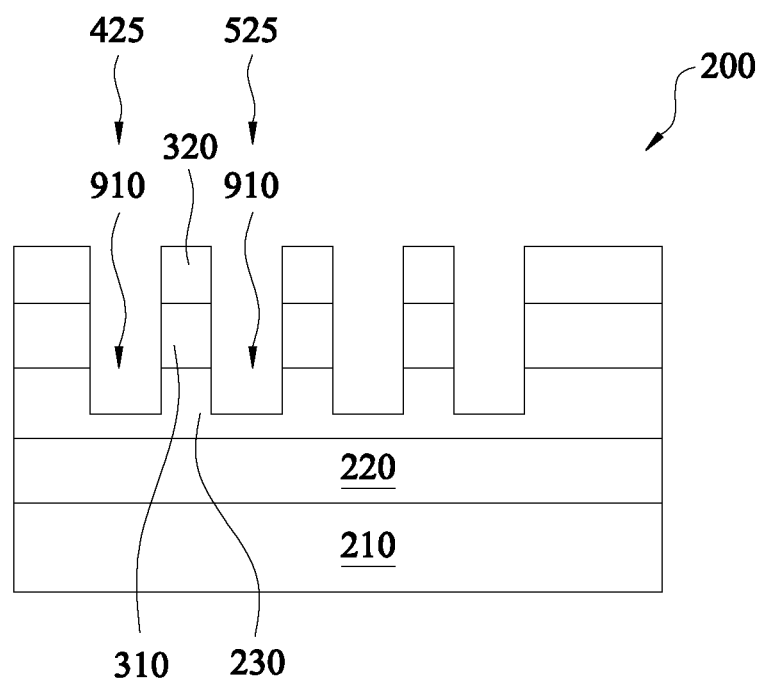
FIG. 12C is a cross-sectional view of an example semiconductor device in accordance with some embodiments, along the line B-B in FIG. 12A.

Referring to FIGS. 1 and 11A-11F, method 100 proceeds to step 120 by etching the first HM layer 310 and the middle layer 230 through the fourth patterned resist 810 to form a plurality of fourth holes 825 in the middle layer 230 in the second trench 525. Respective portions of the first material layer 220 are exposed within the fourth holes 825. The etch process may include wet etch, dry etch, or a combination thereof. In the present embodiments, the etch process is properly chosen to selectively etch the first HM layer 310 and the middle layer 230, but does not substantially etch the second HM layer 320 and the sacrificial layer 710 (in the second hole 625). Thus, the second HM layers 320 and the sacrificial layer 710 serve as a sub-etch-mask during the etch process and the fourth holes 825 are formed within the second trench 525 with a self-alignment manner, as shown in FIGS. 11D-11F. A resist strip process is then applied to remove any remaining fourth patterned resist layers 810. The sacrificial layer 710 is selectively removed by a proper etching process as well. The second and fourth holes, 625 and 825, are formed in the middle layer 230 within the first and second trench 425 and 535, respectively. Portions of the first material layer 220 is exposed within the second and fourth holes, 625 and 825, as shown in FIGS. 11G-11I.

Referring to FIGS. 1 and 12A-12C, method 100 proceeds to step 122 by extending the first and second trenches, 425 and 525, into an upper portion of the middle layer 230, referred to as third trenches 910. In some embodiments, the second trench 525 is extended to the middle layer 230 first by selectively etching the first HM layer 310 but not substantially etching the second HM layer 320, the middle layer 230 and the first material layer 220 (in the fourth hole 825). Thus, the second HM layer 320 serves as an etching-mask. Then the first and second trenches, 425 and 525 are extended to the upper portion of the middle layer 230 by selectively etching the upper portion of the middle layer 230 but not substantially etching the second HM layer 320. Thus, the second HM layer 320 serves as an etching-mask. Therefore the first and second trenches, 425 and 525, are extended to the middle layer with a self-alignment manner. As has been mentioned previously, with an adequate etch selectivity, the first material layer 220 serves as an etch stop layer, which improves etch process window and profile control.

Figure 13A:
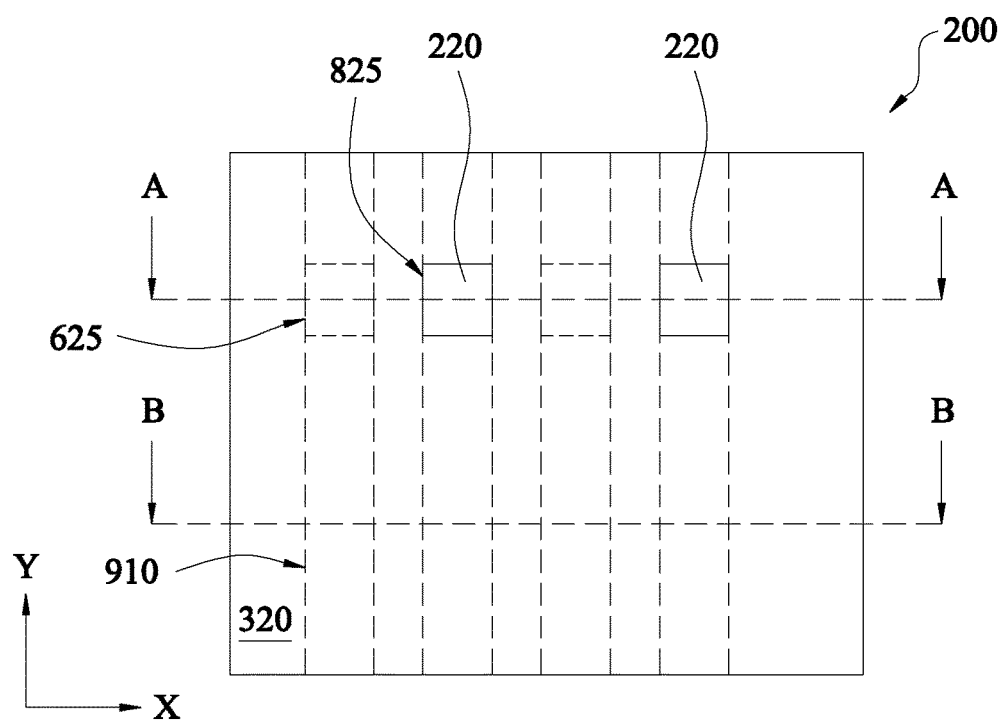
FIG. 13A is a top view of an example of a semiconductor device in accordance with some embodiments.
Figure 13B:
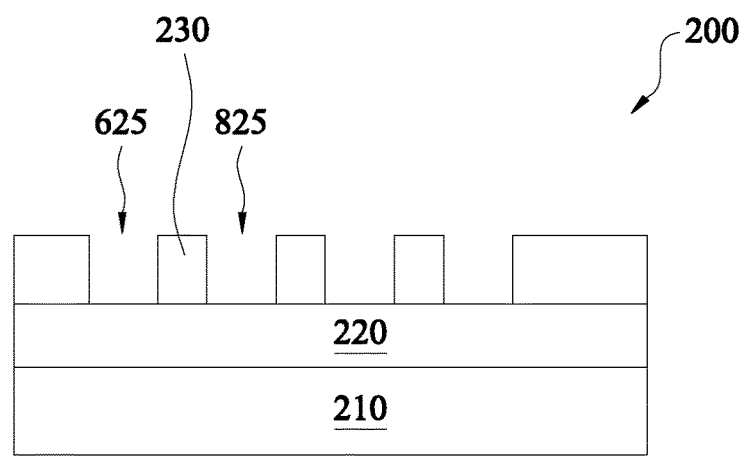
FIG. 13B is a cross-sectional view of an example semiconductor device in accordance with some embodiments, along the line A-A in FIG. 13A.
Figure 13C:
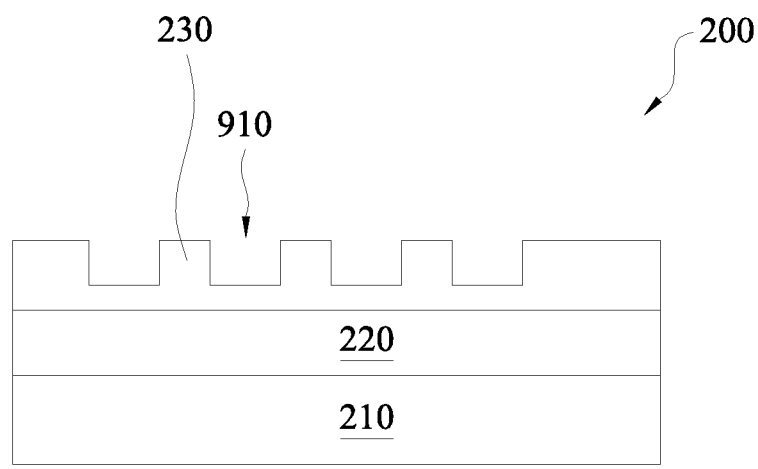
FIG. 13C is a cross-sectional view of an example semiconductor device in accordance with some embodiments, along the line B-B in FIG. 13A.

The first and second HM layers, 425 and 525, are then removed by a selective etch process, which etch the first and second HM layers, 425 and 525, but does not substantially etch the middle layer 230 and the first material layer 220. Thus, the middle layer 230 has the second and fourth holes, 625 and 825, and the third trenches 910 such that the first material layer 220 is exposed in the second and fourth holes, 625 and 825 but not in the third trenches 910, as shown in FIGS. 13A-13C.

Additional steps can be provided before, during, and after the methods of 100 and some of the steps described can be replaced, eliminated, or moved around for additional embodiments of the method of 100. Other alternatives or embodiments may present without departure from the spirit and scope of the present disclosure.

Figure 14:
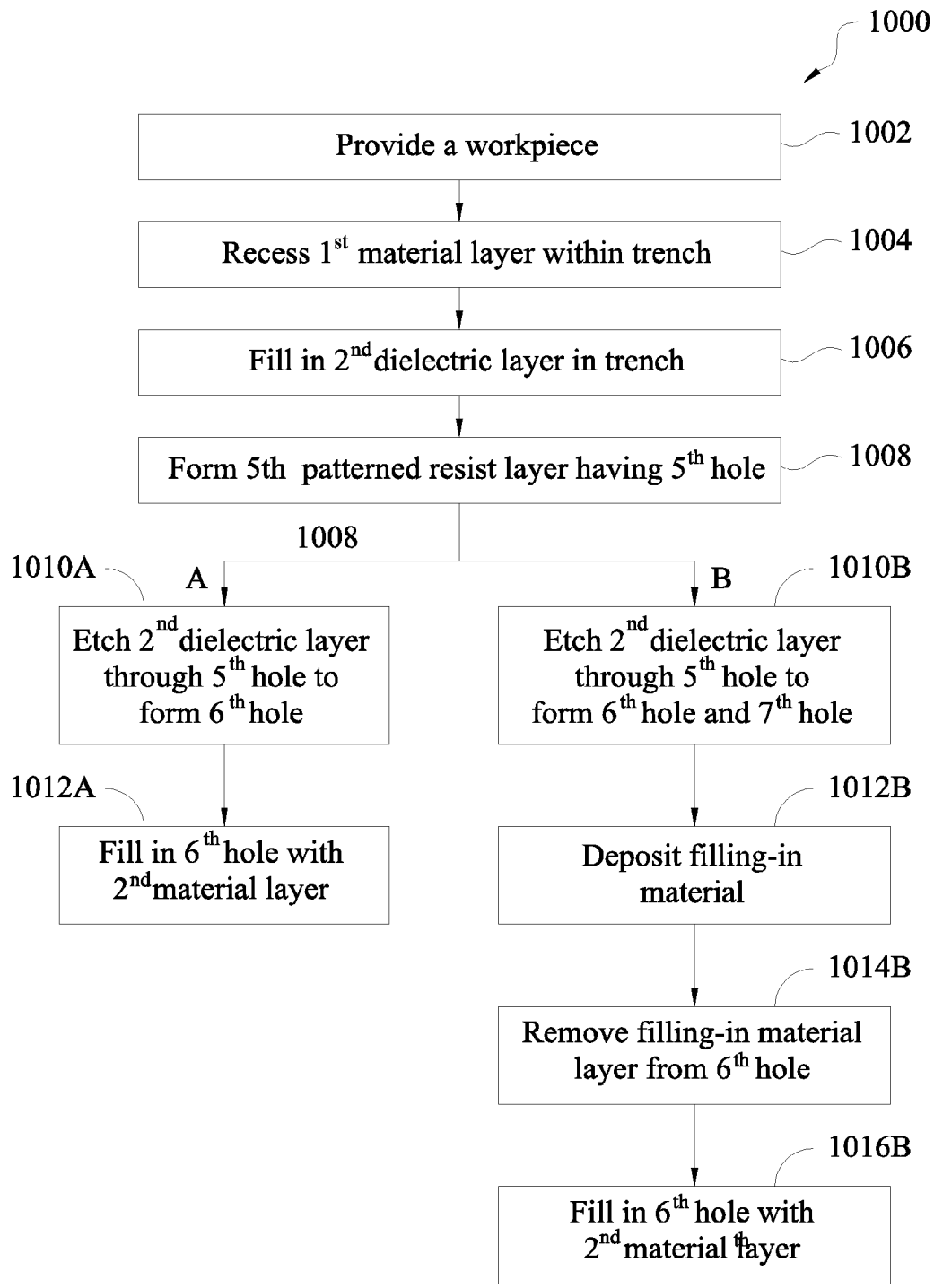
FIG. 14 is a flowchart of another example method for fabricating a semiconductor device constructed in accordance with some embodiments.

FIG. 14 is a flowchart of another example method 1000 for fabricating a semiconductor device 2000. The method 1000 is discussed in detail below, with reference to the semiconductor device 2000 shown in FIGS. 15A to 25B. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 15A:
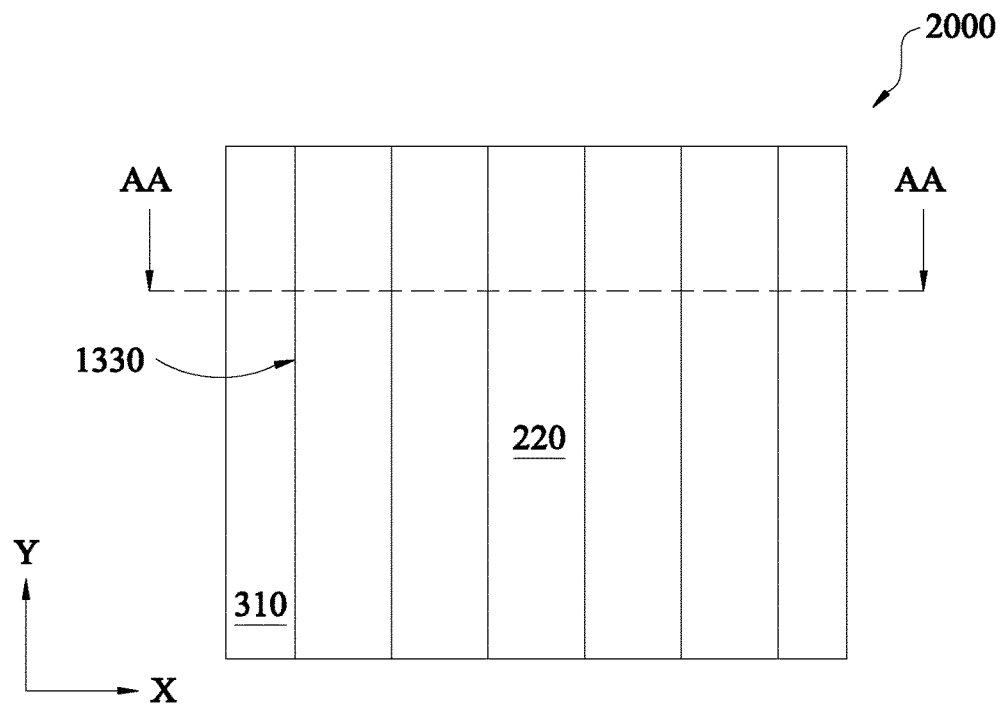
FIG. 15A is a top view of an example of a semiconductor device in accordance with some embodiments.
Figure 15B:
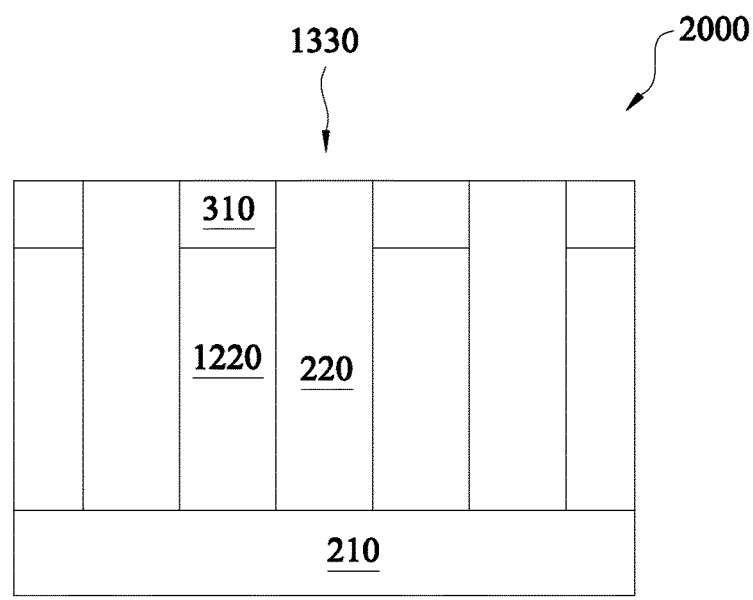
FIG. 15B is a cross-sectional view of an example semiconductor device in accordance with some embodiments, along the line AA-AA in FIG. 15A.

Referring to FIGS. 14 and 15A-15B, the method 1000 starts at step 1002 by receiving a workpiece 2005 of the semiconductor device 2000. The workpiece 2005 includes the substrate 210, a first dielectric layer 1220 deposited over the substrate 210 and the first HM layer 310 deposited over the first dielectric layer 1220. A plurality of first trenches 1330 are formed, along the Y-direction, in the first HM layer 310 and extends through the first dielectric layer 1220. The first trenches 1330 are filled in by the first material layer 220. The first dielectric layer 1220 may include silicon oxide, silicon nitride, oxynitride, silicon carbide, low-k dielectric material, spin-on glass, and/or other suitable materials. In the present embodiment, the first dielectric layer 1220 includes a material which is different from the first HM layer 310 to achieve etching selectivity subsequent etches.

In some embodiments, the first trenches 1330 are formed by forming a patterned resist layer over the first HM layer 310, then etching the first HM layer 310 through the patterned resist layer to form the first trenches 1330 in the first HM layer 310, then etching the first dielectric layer 1220 to extend the first trenches 1330 through the first dielectric layer 1220.

Figure 16A:
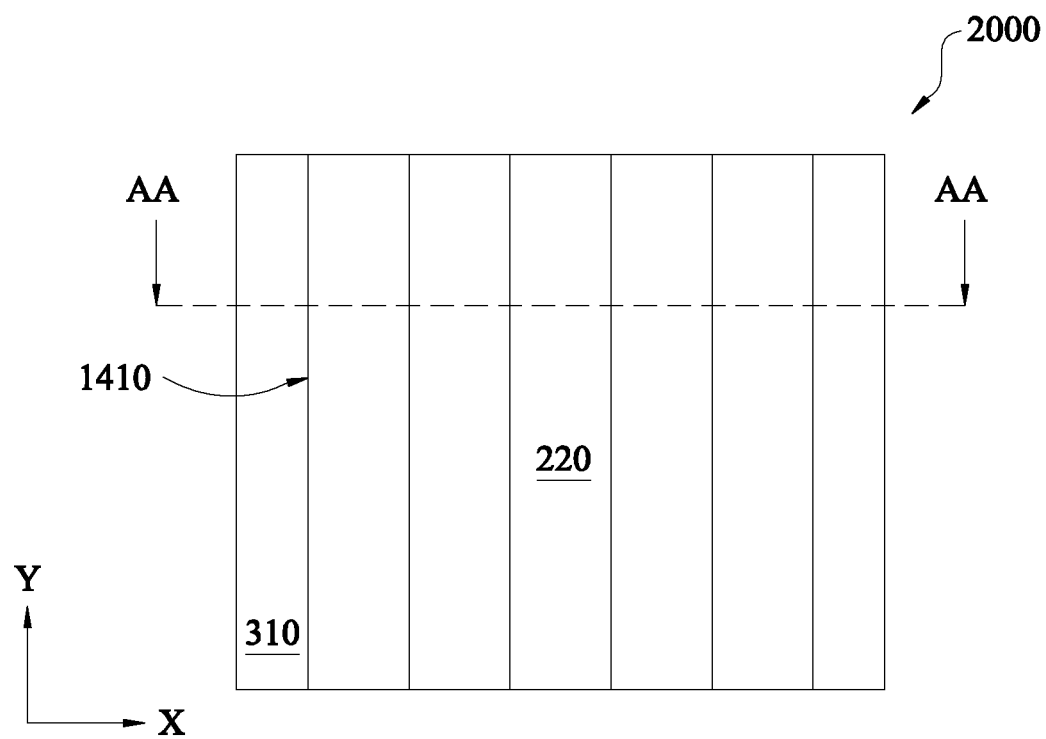
FIG. 16A is a top view of an example of a semiconductor device in accordance with some embodiments.
Figure 16B:
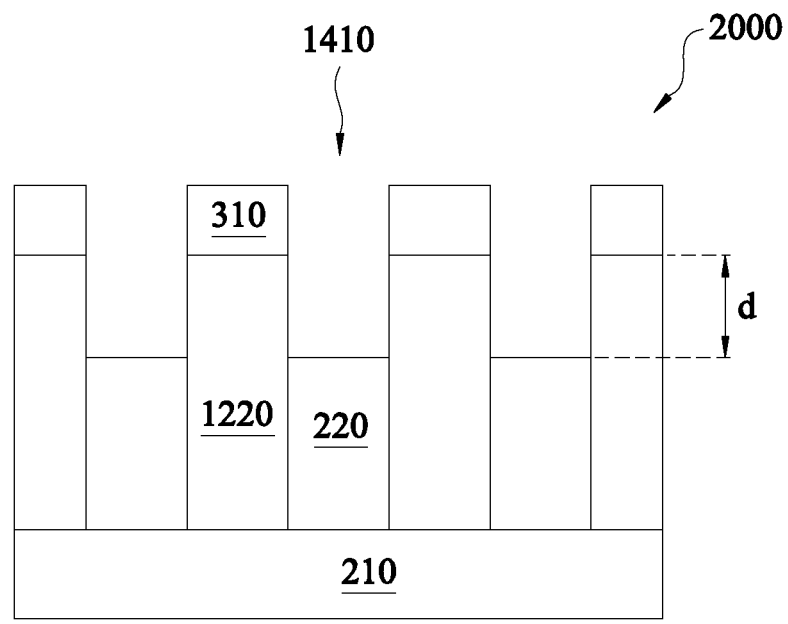
FIG. 16B is a cross-sectional view of an example semiconductor device in accordance with some embodiments, along the line AA-AA in FIG. 16A.

Referring to FIGS. 14 and 16A-16B, once the workpiece 2005 is received, the method 1000 proceeds to step 1004 by recessing the first material layer 220 to form a plurality of second trenches 1410. The first material layer 220 is recessed such that its top surface is below a top surface of the dielectric layer 1220 by a distance d. In some embodiments, the etch process is properly chosen to selectively etch the first material layer 220 but does not substantially etch the first HM layer 310, thus the first HM layer 310 serves as an etch-mask.

Figure 17A:
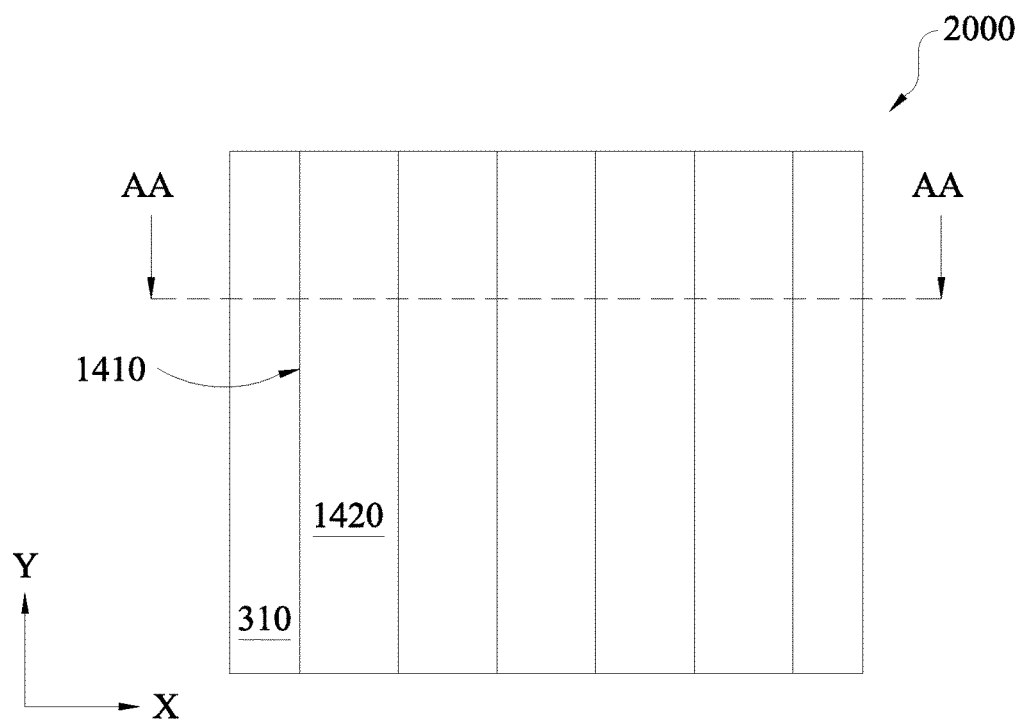
FIG. 17A is a top view of an example of a semiconductor device in accordance with some embodiments.
Figure 17B:
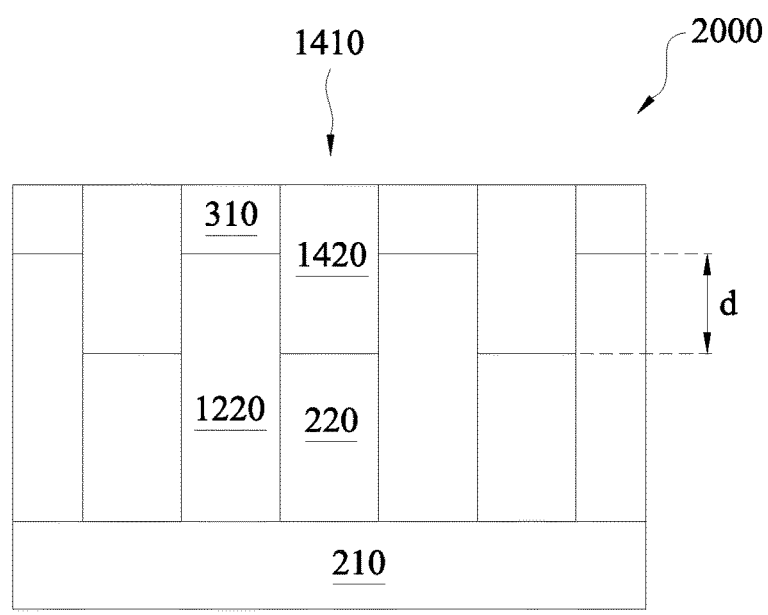
FIG. 17B is a cross-sectional view of an example semiconductor device in accordance with some embodiments, along the line AA-AA in FIG. 17A.

Referring to FIGS. 14 and 17A-17B, the method 1000 proceeds to step 1006 by filling in the second trenches 1410 with a second dielectric layer 1420 such that the first material layer 220 is embedded in the first and second dielectric layers, 1220 and 1420. In the present embodiment, the second dielectric layer 1420 includes a material which is different from the first material layer 220 and the first HM layer 310 to achieve etching selectivity subsequent etches. In some embodiments, the second dielectric layer 1420 is same material as the first dielectric layer 1220. The second dielectric layer 1420 may be deposited by CVD, ALD, spin-on or other suitable techniques. A recess process, such as a CMP, may be performed to polish back the excessive second dielectric layer 1420 and planarize a top surface of the second dielectric layer 1420 with a top surface of the first HM layer 310.

Figure 18A:
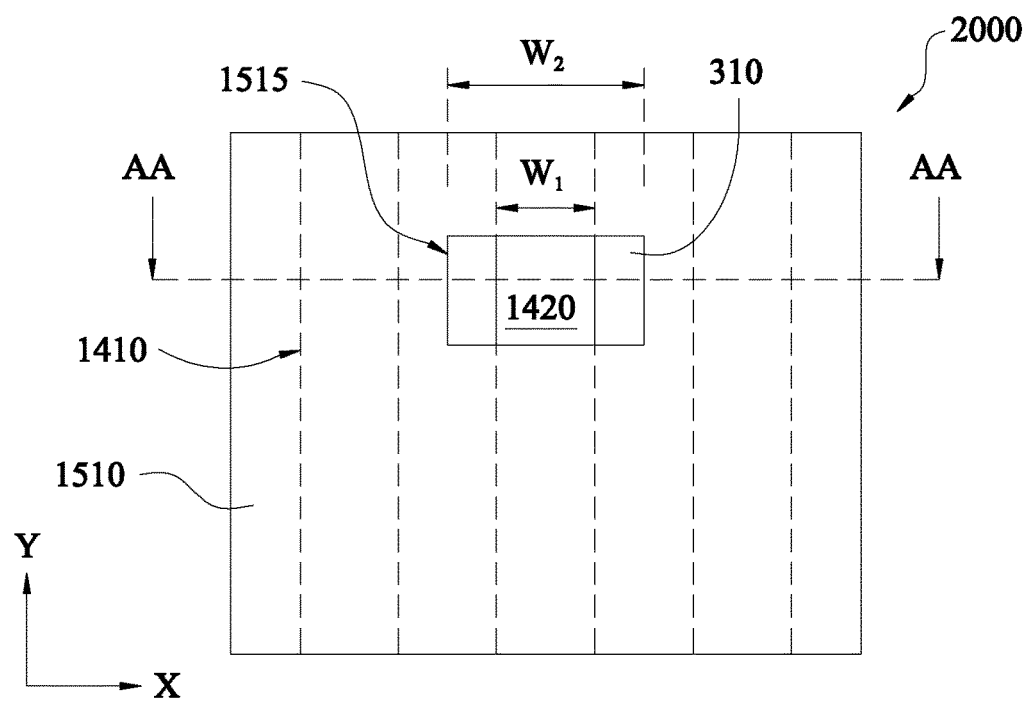
FIG. 18A is a top view of an example of a semiconductor device in accordance with some embodiments.
Figure 18B:
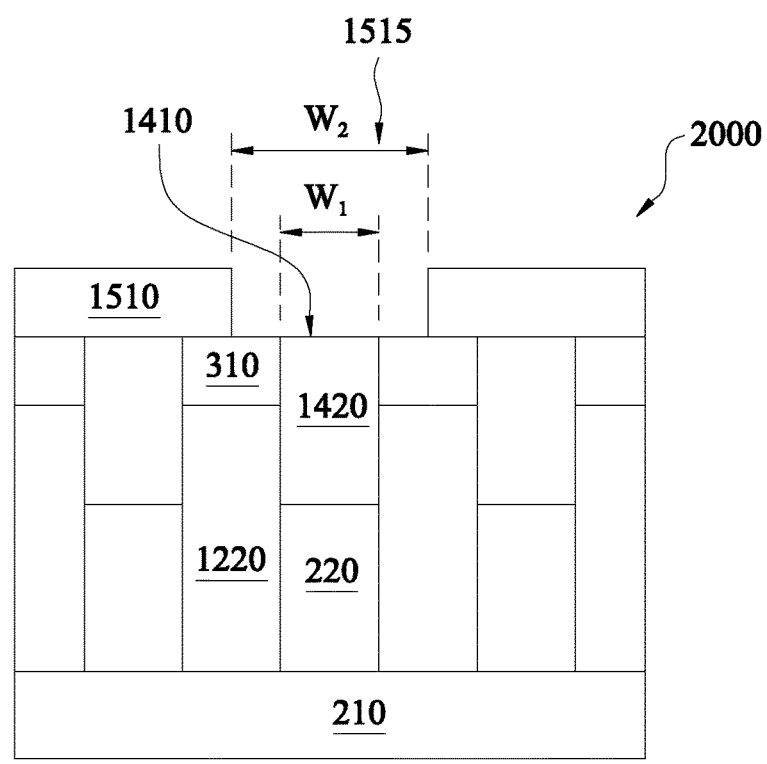
FIG. 18B is a cross-sectional view of an example semiconductor device in accordance with some embodiments, along the line AA-AA in FIG. 18A.

Referring to FIGS. 14 and 18A-18B, the method 1000 proceeds to step 1008 by forming a first patterned resist layer 1510 over the first HM layer 310 and the second dielectric layer 1420. The first patterned resist layer 1510 has a plurality of first holes 1515 aligning to and overlapping with the second trench 1410. The first patterned resist layer 1510 is formed similarly in many respects to the first patterned resist layer 410 discussed above association with FIGS. 3A-3B.

Figure 19A:
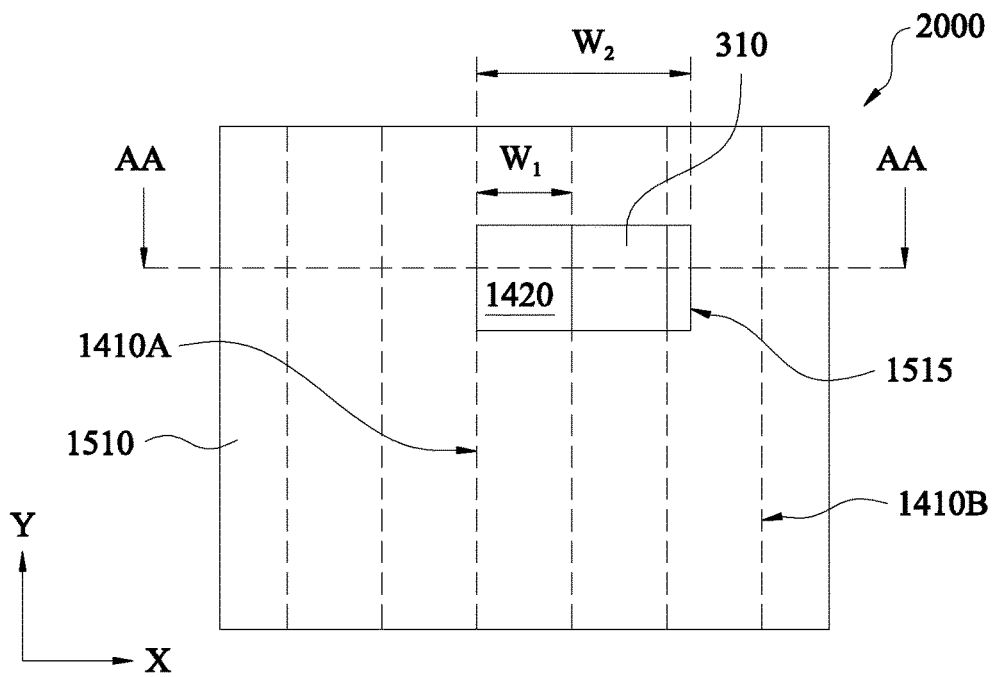
FIG. 19A is a top view of an example of a semiconductor device in accordance with some embodiments.
Figure 19B:
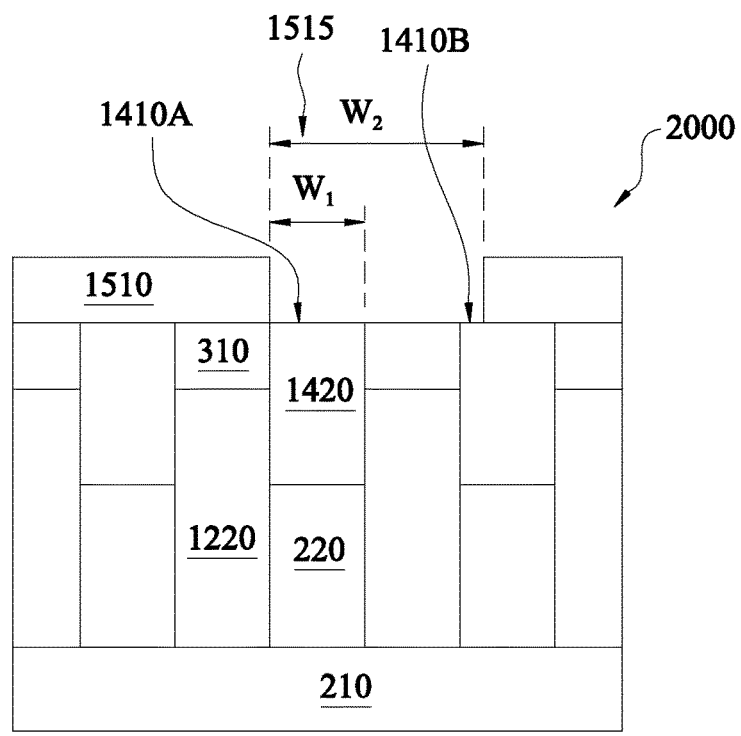
FIG. 19B is a cross-sectional view of an example semiconductor device in accordance with some embodiments, along the line AA-AA in FIG. 19A.

In some embodiments, a width of the first hole 1515 (referred to as a second width $w_2$) is greater than a width of the second trench 1410 (referred to as a first width $w_1$). In this situation, not only the respective portion of the second dielectric layer 1420 but also a portion of the first HM layer 310 adjacent to the second trench 1410 is exposed within the first holes 1515, as shown in FIGS. 18A and 18B. In some embodiment, the second width $d_2$ is wider such that a portion of an adjacent second trench 1410 is also exposed first hole 1515, as well as the HM layer 310 disposed between the trenches, as shown in FIGS. 19A-19B. For the sake of clarity to better illustration of concepts of the present disclosure, the partially exposed adjacent second trench is referred to as 1410B while the second trench 1410, which the first hole 1515 is aligned to, is referred to as 1410A. In some embodiment, the second width $w_2$ may be designed to be greater than the first width $w_1$ to obtain advantages, such as relaxing lithography process resolution constrains. In some embodiments, the second width $w_2$ is formed larger than its target width due to adverse process impacts, such as pattern irregularities/distortions caused by a lithography process.

The method 1000 has two paths after step 1008, identified by the suffix "A" and "B," respectively. These two paths are separately discussed below. The path A is for circumstances where no second trench 1410B is exposed within the first hole 1515 (as shown in FIGS. 18A-18B) and the path B is for circumstances where the second trench 1410B is exposed within the first hole 1515 (as shown in FIGS. 19A-19B) as well. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 20A:
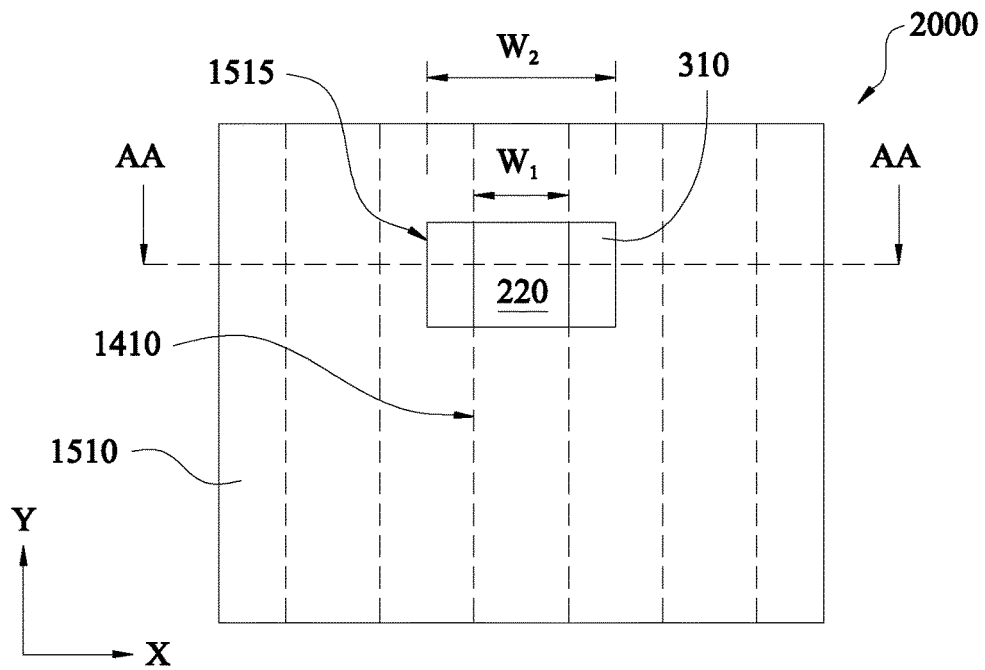
FIG. 20A is a top view of an example of a semiconductor device in accordance with some embodiments.
Figure 20B:
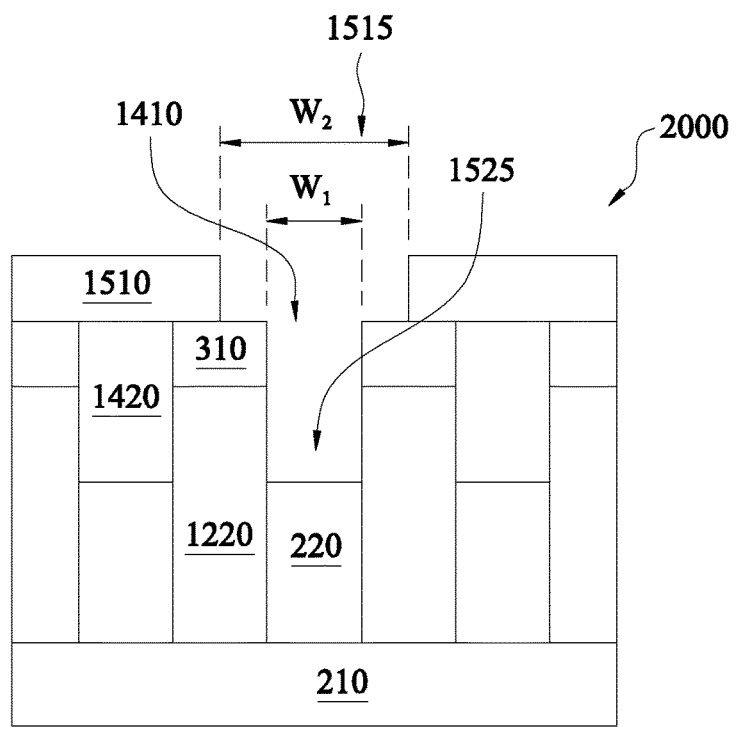
FIG. 20B is a cross-sectional view of an example semiconductor device in accordance with some embodiments, along the line AA-AA in FIG. 20A.
Figure 20C:
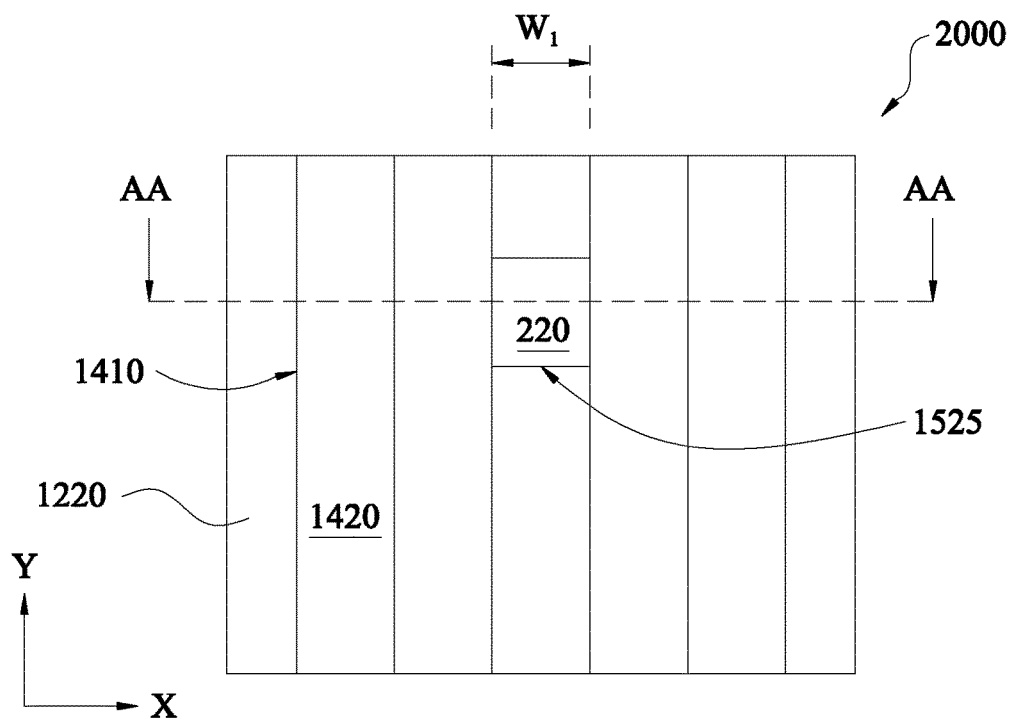
FIG. 20C is a top view of an example of a semiconductor device in accordance with some embodiments.
Figure 20D:
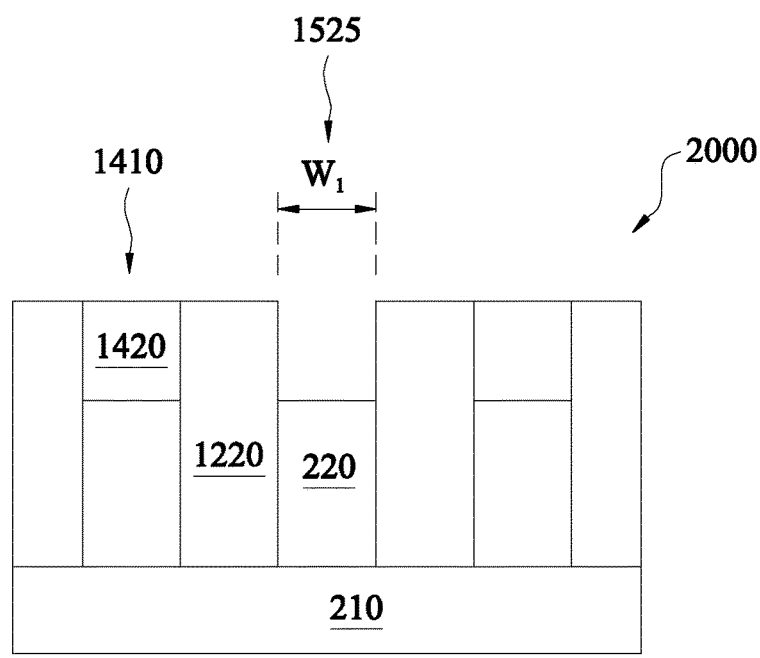
FIG. 20D is a cross-sectional view of an example semiconductor device in accordance with some embodiments, along the line AA-AA in FIG. 20C.

Referring to FIGS. 14 and 20A-20B, for the path A, the method 1000 proceeds to step 1010A by removing the second dielectric layer 1420 within the second trench 1410 through the first holes 1515 to form a second holes 1525 such that the first material layer 220 is exposed within the second hole 1525. In the present embodiment, the etch process is properly chosen to selectively etch the second dielectric layer 1420 but does not substantially etch the first HM layer 310. Therefore the exposed first HM 310 within the first hole 1515 serves as a sub-etch-mask and the second hole 1525 is formed with a self-alignment nature. A resist strip process is then applied to remove any remaining first patterned resist layers 1510. The first HM layer 310 is also removed by a proper etch process, as shown in FIGS. 20C and 20D.

Figure 21A:
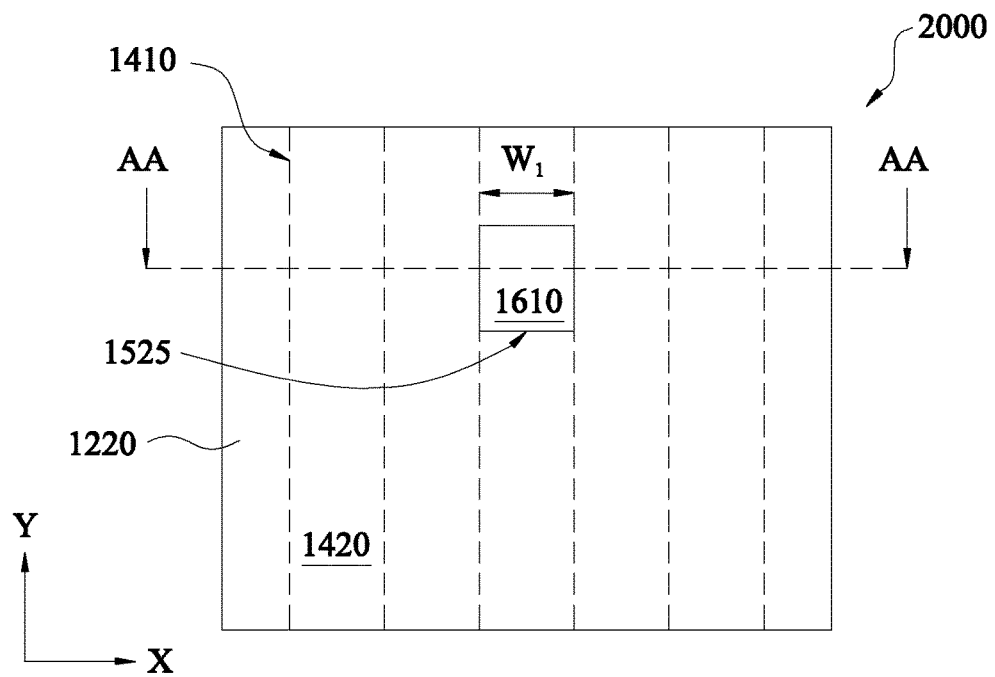
FIG. 21A is a top view of an example of a semiconductor device in accordance with some embodiments.
Figure 21B:
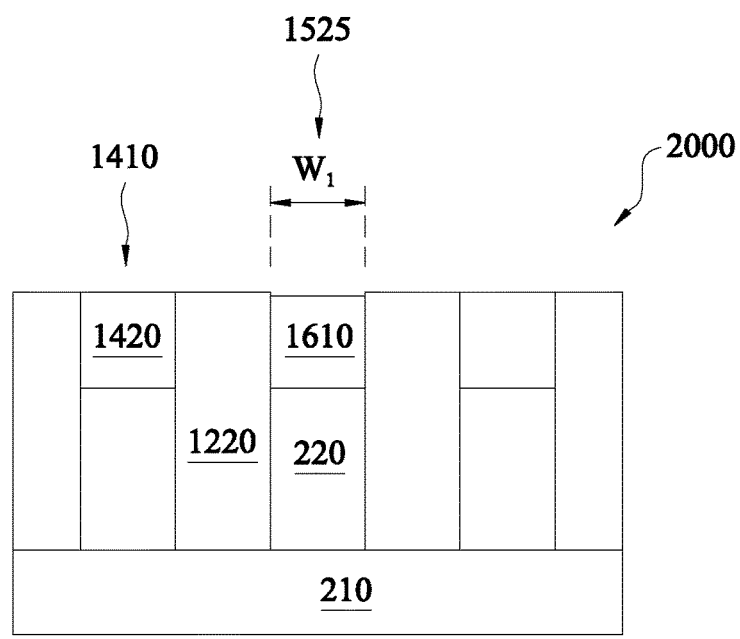
FIG. 21B is a cross-sectional view of an example semiconductor device in accordance with some embodiments, along the line AA-AA in FIG. 21A.

Referring to FIGS. 14 and 21A-21B, for the path A, the method 1000 proceeds to step 1012A by filling in the second hole 1525 with a second material layer 1610. The second material layer 1610 may include a conductive layer such as a metal layer, or/and other suitable material. In some embodiments, both of the first and second material layers, 220 and 1610, are conductive materials. Thus they are connected to each other within the second hole 1525 to provide to connections to the various features or structures of the semiconductor devices 200. The second material layer 1610 may be deposited by CVD, PVD, ALD, or other suitable techniques. A CMP may be performed to polish back the excessive second material layer 1610 and planarize a top surface of the second material layer 1610 with a top surface of the first HM layer 310.

Figure 22A:
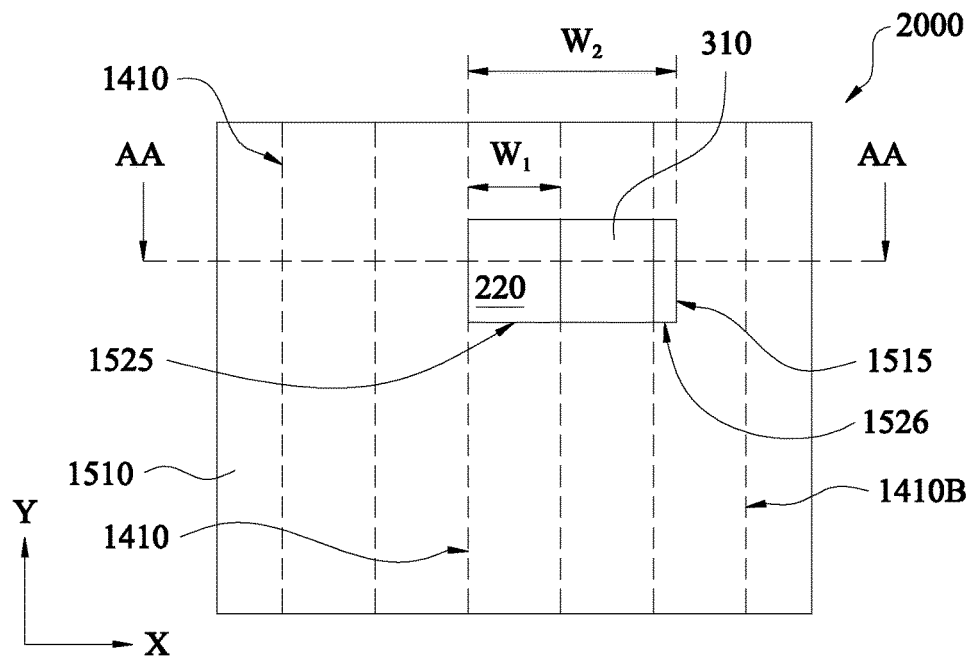
FIG. 22A is a top view of an example of a semiconductor device in accordance with some embodiments.
Figure 22B:
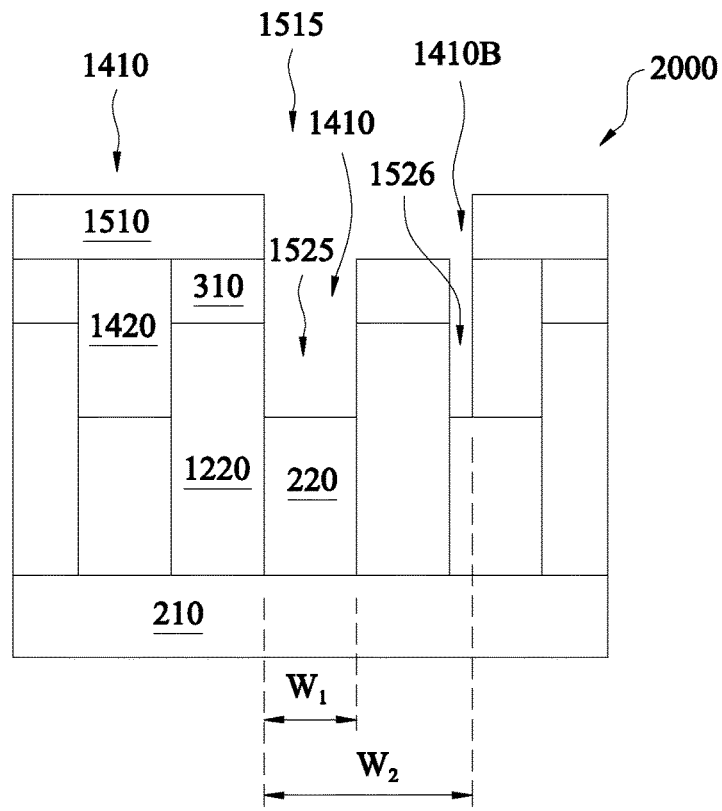
FIG. 22B is a cross-sectional view of an example semiconductor device in accordance with some embodiments, along the line AA-AA in FIG. 22A.
Figure 22C:
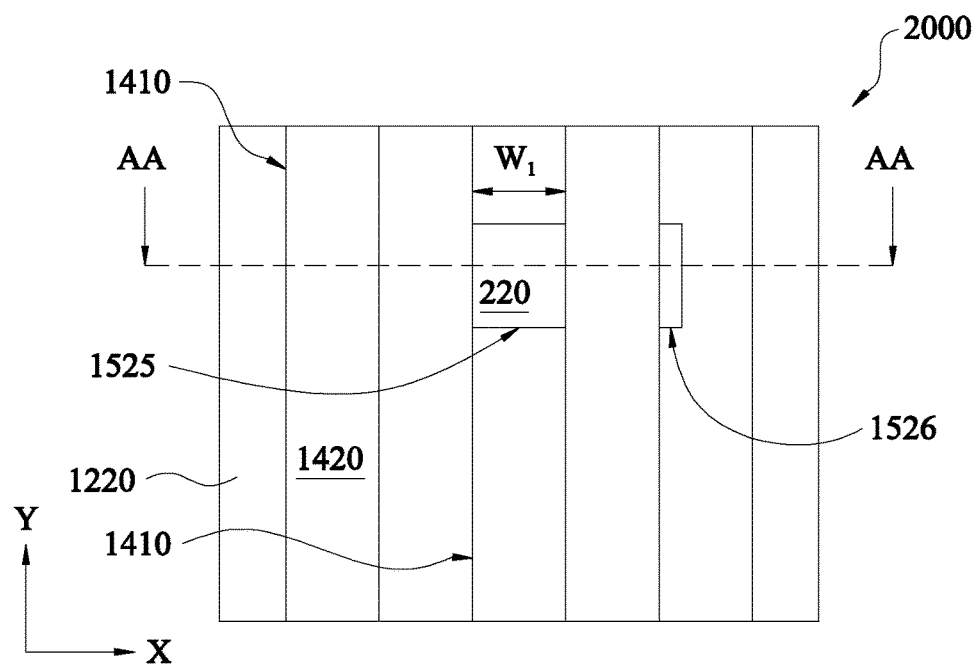
FIG. 22C is a top view of an example of a semiconductor device in accordance with some embodiments.
Figure 22D:
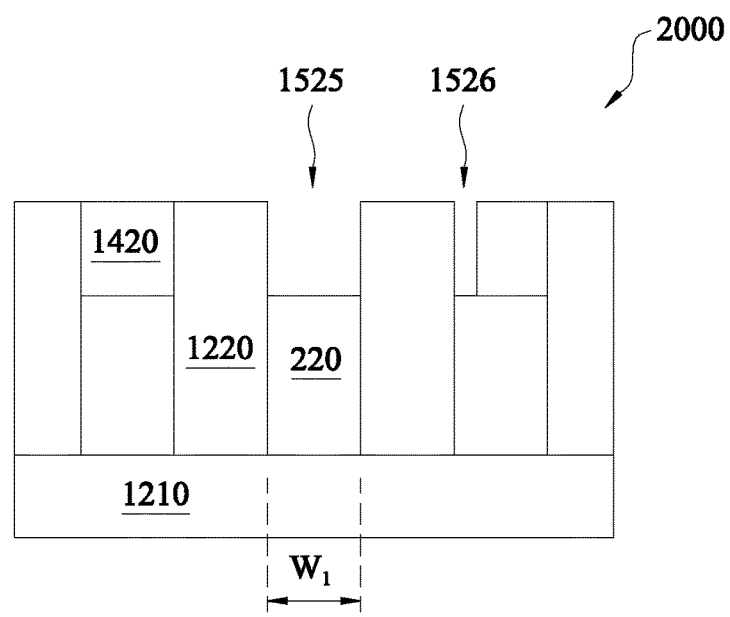
FIG. 22D is a cross-sectional view of an example semiconductor device in accordance with some embodiments, along the line AA-AA in FIG. 22C.

Referring to FIGS. 14 and 22A-22B, for the path B, the method 1000 proceeds to step 1010B by etching the second dielectric layer 1420 within the second trench 1410A through the first holes 1515 to form the second hole 1525 within the second trench 1410. At the same time, the exposed portion of the second dielectric layer 1420 in the second trench 1410B is also etched and it forms a sub-trench 1526 in the second trench 1410B. Since a width of the sub-trench 1526 is a partial of the first width $w_1$, it is much smaller than a width of the second hole 1525, the first width $w_1$. In the present embodiment, the etch process is properly chosen to selectively etch the second dielectric layer 1420 but does not substantially etch the first HM layer 310 and the first dielectric layer 1220. Therefore the exposed first HM layer 310 within the first hole 1515 serves as a sub-etch-mask to endue the second hole 1525 to be formed with a self-alignment nature. The remaining first patterned resist layer 1510 and the first HM layer 310 are removed by proper etch processes thereafter. Respective portions of the first material layer 220 are exposed within the second hole 1525 and the sub-trench 1526, as shown in FIGS. 22C and 22D.

Figure 23A:
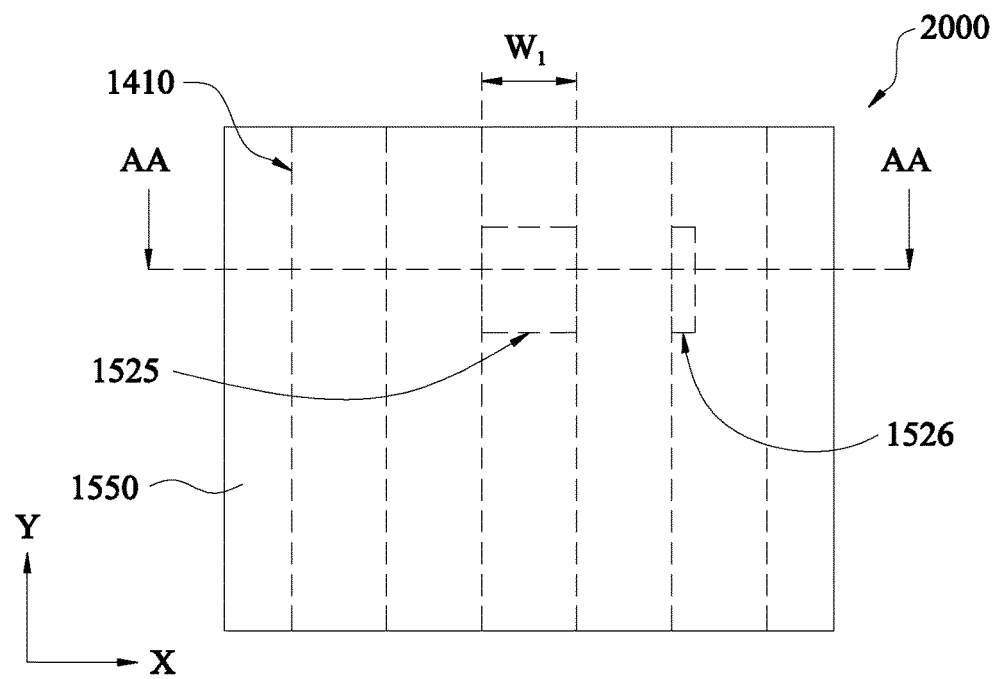
FIG. 23A is a top view of an example of a semiconductor device in accordance with some embodiments.
Figure 23B:
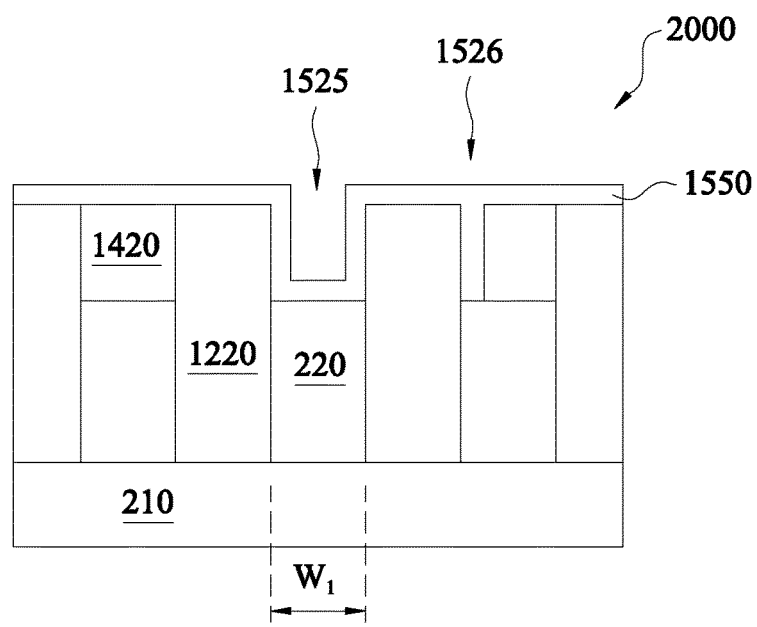
FIG. 23B is a cross-sectional view of an example semiconductor device in accordance with some embodiments, along the line AA-AA in FIG. 23A.

Referring to FIGS. 14 and 23A-23B, for the path B, the method 1000 proceeds to step 1012B by depositing a material layer 1550 to fill in the second hole 1525 and the sub-trench 1526. In the present embodiment, a thickness of the filling-in material layer 1550 is controlled such that the sub-trench 1526 completely filled in while the second hole 1525 is partially filled in, which results in a thickness of the filling-in material layer 1550 in the second hole 1525 being much thinner than a thickness of the filling-in material layer 1550 in the sub-trench 1526. The filling-in material layer 1550 may include spin-on glass, silicon oxide, silicon nitride, oxynitride, silicon carbide, low-k dielectric material, and/or other suitable materials. In present embodiment, the filling-in material layer 1550 includes a material which is different from the first material layer 220, the first dielectric layer 1220 and the second dielectric material layer 1420 to achieve etching selectivity in subsequent etches. The filling-in material layer 1550 may be deposited by CVD, PVD, ALD, spin-on coating, or other suitable techniques.

Figure 24A:
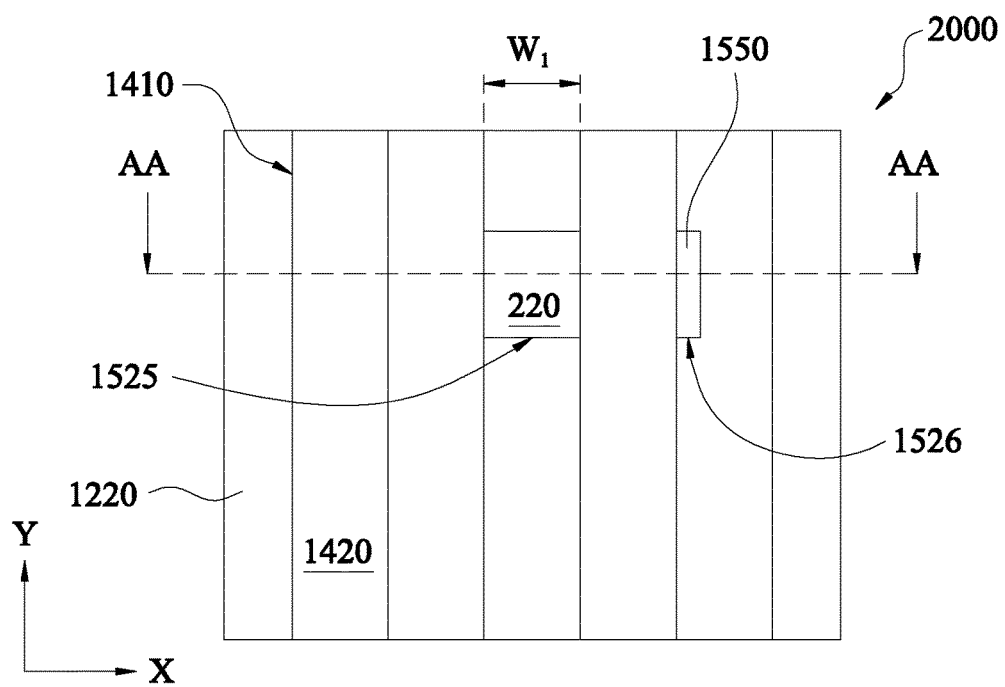
FIG. 24A is a top view of an example of a semiconductor device in accordance with some embodiments.
Figure 24B:
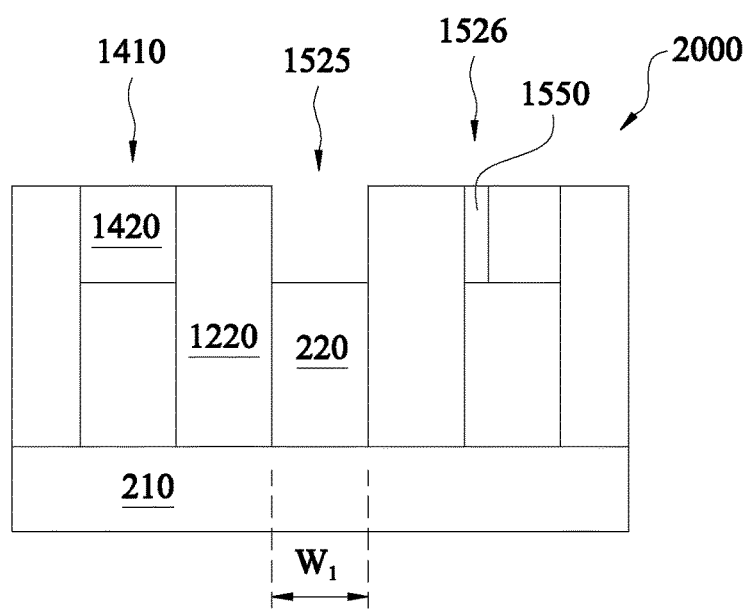
FIG. 24B is a cross-sectional view of an example semiconductor device in accordance with some embodiments, along the line AA-AA in FIG. 24A.

Referring to FIGS. 14 and 24A-24B, for the path B, the method of 1000 proceeds to step 1014B by removing filling-in material layer 1550 from the second hole 1525. The etch process is properly chosen such that the filling-in material layer 1550 in the second hole 1525 is removed and an adequate remaining thickness of the filling-in material layer 1550 in the sub-trench 1526 is remained. Therefore, the first material layer 220 is exposed within the second hole 1525 while it is covered by the filling-in material 1550 in the sub-trench 1526. In some embodiment, the etch process include a selective isotropic wet etch, or a selective isotropic dry etch, such that it etches the filling-in material layer 1550 but does not substantially etch the first and second dielectric layers, 1220 and 1420.

Figure 25A:
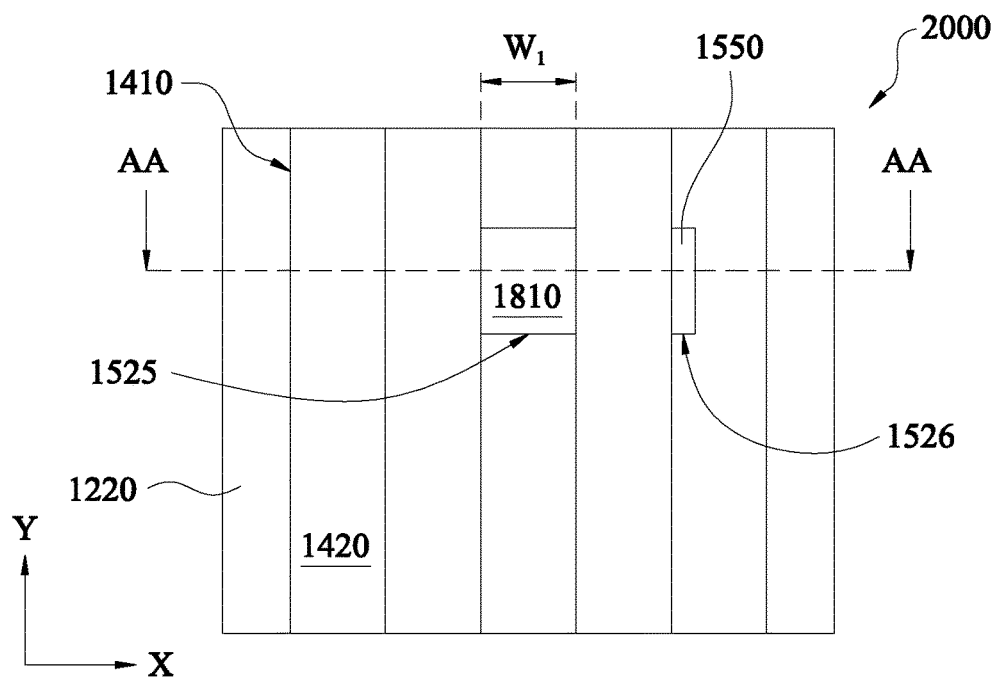
FIG. 25A is a top view of an example of a semiconductor device in accordance with some embodiments.
Figure 25B:
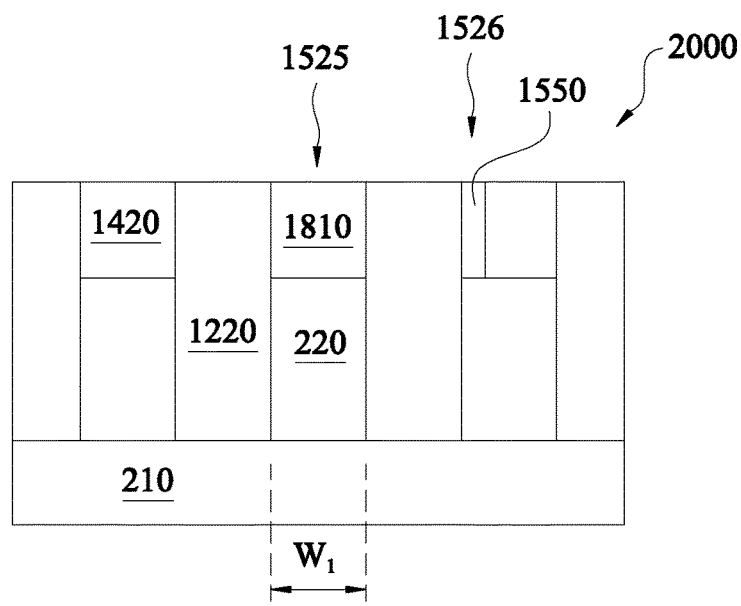
FIG. 25B is a cross-sectional view of an example semiconductor device in accordance with some embodiments, along the line AA-AA in FIG. 25A.

Referring to FIGS. 14 and 25A-215B, for the path B, the method 1000 proceeds to step 1016B by filling in the second hole 1525 by the second material layer 1610 to contact the first material layer 220. In some embodiments, both of the first and second material layers, 220 and 1610, are conductive materials. Thus they are connected to each other within the second hole 1525 to provide to connections to the various features or structures of the semiconductor device 2000. Other alternatives or embodiments may present without departure from the spirit and scope of the present disclosure.

Additional steps can be provided before, during, and after the methods of 1000 and some of the steps described can be replaced, eliminated, or moved around for additional embodiments of the method of 1000. Other alternatives or embodiments may present without departure from the spirit and scope of the present disclosure.

Based on the above, it can be seen that the present disclosure provides methods of forming hole-type features in a material layer with self-alignment nature. The methods employ HM layers, filling-in material layers and sacrificial layers as sub-etch masks to endue formation of the hole-type feature with a self-alignment nature. The methods demonstrate relaxing lithography process resolution constrains and reducing adverse process impacts, such as pattern irregularities/distortions in the lithography process. The method provides a robust integration of forming connection path between layers.

The present disclosure provides many different embodiments of fabricating a semiconductor device that provide one or more improvements over existing approaches. In one embodiment, a method for fabricating a semiconductor device includes forming a first material layer over a substrate, forming a middle layer over the first material layer, forming a first hard mask (HM) layer over the middle layer, forming a second HM layer over the first HM layer, forming a first trench in the second HM layer that extends into the first HM layer, forming a second trench in the second HM layer, The second trench is parallel to the first trench. The method also includes forming a first hole feature in the middle layer within the first trench by using the second HM layer and the first HM layer as a mask and forming a second hole feature in the middle layer within the second trench by using the second HM layer as a mask.

In another embodiment, a method includes providing a workpiece, including a hard mask (HM) layer over a first dielectric layer, a trench extending through the HM layer and the first dielectric layer and a first material layer filling in the trench. The method also includes recessing the first material layer to leave the trench be partially filled, depositing a second dielectric layer over the recessed first material layer to fill the trench, forming a patterned resist layer having a hole-type opening over the trench and removing the second dielectric layer within the trench through the hole-type opening by using the HM layer adjacent to the trench as a sub-etch-mask.

In yet another embodiment, a device includes providing a workpiece, including a hard mask (HM) layer over a first dielectric layer, a first trench extending through the HM layer and the first dielectric layer, a second trench, parallel to the first trench, extending through the HM layer and the first dielectric layer and a first material layer filling in the first trench and the second trench. The method also includes recessing the first material layer to leave the first trench and the second trench partially be filled, depositing a second dielectric layer over the recessed first material layer to fill the first trench and the second trench, forming a patterned resist layer having an opening over second dielectric layer, removing the second dielectric layer in the first trench through the opening, removing the second dielectric layer in the second trench through the opening to form a sub-trench within the second trench, forming a filling-in material in the sub-trench and forming a second material layer in the first trench to contact the first material layer while the sub-trench filled by the filling-in material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a workpiece, including:
   a hard mask (HM) layer over a first dielectric layer;
   a trench extending through the HM layer and the first dielectric layer; and
   a first material layer filling in the trench;
   recessing the first material layer to leave the trench be partially filled;
   depositing a second dielectric layer over the recessed first material layer to fill the trench;
   forming a patterned resist layer having a hole-type opening over the trench; and
   removing the second dielectric layer within the trench through the hole-type opening by using the HM layer adjacent to the trench as a sub-etch-mask.

2. The method of claim 1, wherein the HM layer adjacent to the trench are exposed within the opening of the patterned resist layer.

3. The method of claim 1, wherein the first material layer is recessed by a selective etch, which does not substantially etch the HM layer and the first dielectric layer.

4. The method of claim 1, further comprising:
   after removing the second dielectric layer within the trench, depositing a second material layer to contact the first material layer within the trench.

5. A method comprising:
   providing a workpiece, including:
   a hard mask (HM) layer over a first dielectric layer;
   a first trench extending through the HM layer and the first dielectric layer;
   a second trench, parallel to the first trench, extending through the HM layer and the first dielectric layer; and
   a first material layer filling in the first trench and the second trench;
   recessing the first material layer to leave the first trench and the second trench partially be filled;
   depositing a second dielectric layer over the recessed first material layer to fill the first trench and the second trench;
   forming a patterned resist layer having an opening over the second dielectric layer;
   removing the second dielectric layer in the first trench through the opening;
   at same time removing the second dielectric layer in the second trench through the opening to form a sub-trench within the second trench;
   forming a filling-in material layer in the sub-trench; and
   forming a second material layer in the first trench to contact the first material layer while the sub-trench filled by the filling-in material layer.

6. The method of claim 5, wherein the first material layer is recessed by a selective etch, which does not substantially etch the HM layer and the first dielectric layer.

7. The method of claim 5, forming the filling-in material layer in the sub-trench includes:
   filling in the filling-in material layer in the sub-trench and the first trench; and
   removing the filling-in material layer in the first trench.

8. The method of claim 5, wherein the first trench, a portion of the second trench and the HM layer between the first trench and the second trench are exposed within the opening.

9. The method of claim 7, wherein the HM layer serves a sub-etch mask during removing the second dielectric layer through the opening.

10. The method of claim 8, wherein a width of the sub-trench is smaller that a width of the first trench.

11. The method of claim 10, wherein a thickness of the filling-in material layer in the first trench is thinner than a thickness of the filling-in material layer in the sub-trench.

12. The method of claim 5, further comprising:
    prior to forming the second material layer in the first trench, removing the HM layer.

13. A method comprising:
    forming a metal layer;
    forming a first dielectric layer over the metal layer;
    forming a hard mask (HM) layer over the first dielectric layer;
    etching first and second trenches through the HM layer and the first dielectric layer;
    providing a first material layer for partially filling in the first trench and the second trench;
    depositing a second dielectric layer over the first material layer to fill the first trench and the second trench;
    forming an opening in the second dielectric layer;
    removing the second dielectric layer through the opening to re-open the first trench;
    removing the second dielectric layer in the second trench through the opening to form a sub-trench;
    filling-in the sub-trench; and
    forming a second material layer in the first trench to contact the first material layer while the sub-trench filled in.

14. The method of claim 13, wherein the first material layer is deposited and then recessed by a selective etch, which does not substantially etch the HM layer and the first dielectric layer.

15. The method of claim 13, wherein filling-in the sub-trench includes:
    depositing a fill material layer in the sub-trench and the first trench; and
    removing the fill material layer in the first trench.

16. The method of claim 15, wherein the HM layer serves a sub-etch mask during removing the second dielectric layer through the opening.

17. The method of claim 15, wherein the first trench, a portion of the second trench and the HM layer between the first trench and the second trench are exposed within the opening.

18. The method of claim 17, wherein a width of the sub-trench is smaller that a width of the first trench.

19. The method of claim 15, wherein a thickness of the fill material layer in the first trench is thinner than a thickness of the fill material layer in the sub-trench.

20. The method of claim 13, further comprising:
   prior to forming the second material layer in the first trench, removing the HM layer.

* * * * *